(12) United States Patent
Chae et al.

(10) Patent No.: US 9,418,988 B2
(45) Date of Patent: Aug. 16, 2016

(54) GATE ELECTRODE AND GATE CONTACT PLUG LAYOUTS FOR INTEGRATED CIRCUIT FIELD EFFECT TRANSISTORS

(71) Applicants: Kyo-Suk Chae, Suwon-si (KR); Satoru Yamada, Seoul (KR); Sang-Yeon Han, Suwon-si (KR); Young-Jin Choi, Hwasung-si (KR); Wook-Je Kim, Gwacheon-si (KR)

(72) Inventors: Kyo-Suk Chae, Suwon-si (KR); Satoru Yamada, Seoul (KR); Sang-Yeon Han, Suwon-si (KR); Young-Jin Choi, Hwasung-si (KR); Wook-Je Kim, Gwacheon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/461,202

(22) Filed: Aug. 15, 2014

(65) Prior Publication Data

US 2014/0353768 A1 Dec. 4, 2014

Related U.S. Application Data

(62) Division of application No. 12/984,762, filed on Jan. 5, 2011, now Pat. No. 8,823,113.

(30) Foreign Application Priority Data

Jun. 30, 2010 (KR) .................... 10-2010-0062512

(51) Int. Cl.
*H01L 27/088* (2006.01)
*H01L 29/423* (2006.01)
*H01L 29/78* (2006.01)

(52) U.S. Cl.
CPC .......... *H01L 27/088* (2013.01); *H01L 29/4238* (2013.01); *H01L 29/7833* (2013.01)

(58) Field of Classification Search
CPC ............ H01L 29/4238; H01L 27/0207; H01L 27/088; H01L 29/66484
USPC ........... 257/368, 401, E29.026; 438/279, 294
See application file for complete search history.

(56) References Cited

U.S. PATENT DOCUMENTS 5,341,013 A * 8/1994 Koyanagi .............. H01L 27/088
257/368
5,389,810 A 2/1995 Agata et al.
(Continued)

FOREIGN PATENT DOCUMENTS

JP 2004-303966 A 10/2004
KR 10-2004-0070503 A 8/2004
(Continued)

OTHER PUBLICATIONS

Notification of Reason for Refusal with English language translation, Korean Application No. 10-2010-0062512, Jun. 20, 2016.

*Primary Examiner* — Kenneth Parker
*Assistant Examiner* — John Lin
(74) *Attorney, Agent, or Firm* — Myers Bigel & Sibley, P.A

(57) ABSTRACT

A four transistor layout can include an isolation region that defines an active region, the active region extending along first and second different directions. A common source region of the four transistors extends from a center of the active region along both the first and second directions to define four quadrants of the active region that are outside the common source region. Four drain regions are provided, a respective one of which is in a respective one of the four quadrants and spaced apart from the common source region. Finally, four gate electrodes are provided, a respective one of which is in a respective one of the four quadrants between the common source region and a respective one of the four drain regions. A respective gate electrode includes a vertex and first and second extending portions, the first extending portions extending from the vertex along the first direction and the second extending portions extending from the vertex along the second direction.

11 Claims, 22 Drawing Sheets

(56) References Cited

U.S. PATENT DOCUMENTS

| | | | | |
|---|---|---|---|---|
| 5,616,940 | A | * | 4/1997 | Kato ................. H01L 27/11807 257/202 |
| 5,742,086 | A | * | 4/1998 | Rostoker ............ G06F 17/5072 257/296 |
| 5,965,925 | A | * | 10/1999 | Kornachuk ............ G11C 7/065 257/355 |
| 6,600,210 | B1 | | 7/2003 | Kato et al. |
| 7,034,365 | B2 | | 4/2006 | Park et al. |
| 7,482,650 | B2 | | 1/2009 | Murata et al. |
| 7,696,556 | B2 | | 4/2010 | Hur et al. |
| 8,008,698 | B2 | | 8/2011 | Lee et al. |
| 2004/0188773 | A1 | | 9/2004 | Kidoh et al. |

FOREIGN PATENT DOCUMENTS

| | | |
|---|---|---|
| KR | 10-2007-0033800 A | 3/2007 |
| KR | 10-2007-0078567 A | 8/2007 |
| KR | 10-2009-0048013 A | 5/2009 |
| KR | 10-2009-0099863 A | 9/2009 |
| TW | 469649 | 12/2001 |

* cited by examiner

GATE ELECTRODE AND GATE CONTACT PLUG LAYOUTS FOR INTEGRATED CIRCUIT FIELD EFFECT TRANSISTORS

CROSS-REFERENCE TO RELATED APPLICATIONS

This U.S. non-provisional patent application is a divisional of application Ser. No. 12/984,762, filed Jan. 5, 2011, which itself claims priority under 35 U.S.C. §119 of Korean Patent Application No. 10-2010-0062512, filed on Jun. 30, 2010, the entire contents of which are hereby incorporated by reference.

BACKGROUND

Various embodiments described herein relate to integrated circuits, and more particularly, to field effect transistors and field effect transistor circuits for integrated circuits.

Integrated circuits may include memory devices storing data, logic devices performing a logic operation on data, and the like. A hybrid integrated circuit can include a memory device and a logic device together. Integrated circuits may use field effect transistors as the active devices thereof. Due to characteristics such as miniaturization, multifunction and/or low manufacturing cost, integrated circuits have been receiving attention as an important element in the electronics industry. As the electronics industry has been making rapid advancements, demand for highly integrated devices are increasing.

SUMMARY

Various embodiments described herein can provide a four transistor layout for an integrated circuit substrate. The four transistor layout can include an isolation region in the integrated circuit substrate that defines an active region, the active region extending along first and second different directions. A common source region of the four transistors extends from a center of the active region along both the first and second directions to define four quadrants of the active region that are outside the common source region. Four drain regions are provided, a respective one of which is in a respective one of the four quadrants and spaced apart from the common source region. Finally, four gate electrodes are provided, a respective one of which is in a respective one of the four quadrants between the common source region and a respective one of the four drain regions, a respective gate electrode including a vertex and first and second extending portions, the first extending portions extending from the vertex along the first direction and the second extending portions extending from the vertex along the second direction.

In some embodiments, the drain regions and the gate electrodes of a first pair of the four transistors are symmetric with respect to the drain regions and the gate electrodes of a second pair of the four transistors about a portion of the common source region that extends from the center of the active region along the first direction. In other embodiments, the drain regions and the gate electrodes of a first pair of the four transistors are symmetric with respect to the drain regions and the gate electrodes of a second pair of the four transistors about a portion of the common source region that extends from the center of the active region along the second direction.

Four drain contact plugs also may be provided, a respective one of which electrically contacts a respective one of the drain regions in a respective one of the four quadrants. Moreover, a pair of source contact plugs may be provided, a first one of which is between the second extending portions of the gate electrodes of a first pair of the four transistors, a second one of which is between the second extending portions of the gate electrodes of a second pair of the four transistors.

In other embodiments, the ends of the first and second extending portions of the four gate electrodes extend beyond the active region onto the isolation region. In still other embodiments, four gate contact plugs are provided, a respective one of which is electrically connected to a respective one of the four gate electrodes, a first pair of which are connected to a respective one of a pair of the gate electrodes adjacent the vertexes thereof and a second pair of which are connected to a respective one of a pair of the gate electrodes remote from the vertexes thereof. In some embodiments, the second pair of gate contact plugs are contained within the active region.

In some embodiments, the integrated circuit substrate also includes a plurality of memory cells therein that are arranged in an array in a row direction and in a column direction. In some embodiments, the first direction is the row direction and the second direction is the column direction. The four transistors may comprise a sense amplifier for a column of the memory cells.

In still other embodiments, the active region is recessed between the first extending portions of the gate electrodes of a first pair of the four transistors and between the first extending portions of the gate electrodes of a second pair of the four transistors, so that the isolation region protrudes between the first extending portions of the gate electrodes of the first pair of the four transistors and between the first extending portions of the gate electrodes of the second pair of the four transistors.

In yet other embodiments, a respective gate electrode also includes a third extending portion that extends from an end of a respective second extending portion that is remote from the respective vertex and extends along the first direction. In other embodiments, the respective vertex is a first respective vertex and the respective second and third extending portions define a respective second vertex therebetween. The third extending portions may at least partially overlap the isolation regions in some embodiments and, in other embodiments, the third extending portions do not substantially overlap the active region. In yet other embodiments, the ends of the first and third extending portions of the four gate electrodes extend beyond the active region onto the isolation region.

Yet other embodiments can include four gate contact plugs, a respective one of which is electrically connected to a respective one of the four gate electrodes, a pair of which are connected to a respective one of a pair of the gate electrodes adjacent the vertexes thereof and a pair of which are connected to a respective one of a pair of the gate electrodes remote from the first vertexes thereof. In some embodiments, the pair of gate contact plugs that are connected to a respective one of a pair of the gate electrodes remote from the first vertexes thereof are contained within the active region. In still other embodiments, the four gate contact plugs are four first gate contact plugs, the four transistor layout further comprising four second gate contact plugs, a respective one of which is electrically connected to a respective one of the four gate electrodes, a pair of which are connected to a respective one of a pair of the gate electrodes adjacent the second vertexes thereof and a pair of which are connected to a respective one of a pair of the gate electrodes on the third extensions thereof remote from the second vertexes thereof.

In other embodiments, a respective gate electrode also includes a fourth extending portion that extends from an end of a respective first extending portion that is remote from the respective first vertex to an end of the respective third extending portion that is remote from the respective second vertex, along the second direction. A respective gate electrode includes the first through fourth extending portions defining a closed loop gate electrode pattern, a respective one of which surrounds a respective one of the drain regions. Four drain contact plugs may also be provided, a respective one of which electrically contacts a respective one of the drain regions in a respective one of the four quadrants and is surrounded by a respective one of the gate electrodes. Four first gate contact plugs may also be provided, a respective one of which is electrically connected to a respective midpoint of a respective one of the first and third extending portions of the gate electrodes of a first pair of the four transistors. Two second gate contact plugs may be provided, a respective one of which is electrically connected to a respective first vertex of the gate electrodes of a second pair of the four transistors. Two third gate contact plugs also may be provided, a respective one of which is electrically connected at a respective intersection of a respective third and fourth gate extensions of the gate electrodes of the second pair of the four transistors.

Integrated circuit field effect transistors according to other embodiments include an integrated circuit substrate, an isolation region in the integrated circuit substrate that defines an active region, spaced apart source and drain regions in the active region and a gate electrode on the active region between the spaced apart source and drain regions. The gate electrode extends across the active region and onto the isolation region and includes therein a landing pad that is wider than a non-landing pad portion of the gate electrode. A gate contact plug electrically contacts the gate electrode at the landing pad. In some embodiments, the landing pad at least partially overlaps the isolation region and the gate contact plug at least partially overlaps the active region. In some of these embodiments, the landing pad also at least partially overlaps the isolation region, and the gate contact plug also at least partially overlaps the isolation region.

In some embodiments, the landing pad is a first landing pad and the gate contact plug is a first gate contact plug. The gate electrode may also include a second landing pad that is wider than the non-landing pad portion of the gate electrode, and a second gate contact plug that electrically contacts the gate electrode at the second landing pad. The second landing pad may at least partially overlap the active region, and the second gate contact plug may at least partially overlap the active region.

In some of these embodiments, the first landing pad is located at a first end of the gate electrode and the second landing pad is located at a second end of the gate electrode that is opposite the first end. In other embodiments, the first and second landing pads also at least partially overlap the isolation region. The first and second gate contact plugs also at least partially overlap the isolation region.

Moreover, in other embodiments, the gate electrode including the landing pad comprises a first layer comprising polysilicon adjacent the substrate and a second layer comprising metal silicide on the first layer comprising polysilicon, and the gate contact plug comprises the metal and directly contacts the second layer comprising metal silicide. The metal may comprise tungsten.

A semiconductor device according to still other embodiments described herein may include a device isolation disposed in a substrate to define an active region. A gate electrode is disposed on the active region and includes a first extending portion extending in a first direction and a second extending portion extending in a second direction that is different from the first direction. A gate dielectric layer is disposed between the gate electrode and the active region. An interlayer dielectric layer is disposed on the substrate including the gate electrode. A gate contact plug penetrates the interlayer dielectric layer to contact the gate electrode. At least a portion of the gate contact plug overlaps the active region.

In some embodiments, the first extending portion of the gate electrode comprises a first edge portion overlapping a device isolation pattern adjacent to one side of the active region. In other embodiments, the second extending portion of the gate electrode comprises a second edge portion overlapping the device isolation pattern adjacent to another side of the active region.

Moreover, in some embodiments, at least one of the first extending portion or the second extending portion comprises a landing portion and a non-landing portion. A width of the landing portion is greater than a width of the non-landing portion, and the gate contact plug contacts the landing portion. In other embodiments, the first extending portion comprises the landing portion and the non-landing portion, a portion of the landing portion of the first extending portion overlaps the active region, another portion of the landing portion of the first extending portion overlaps the device isolation pattern, and the portion of the landing portion, overlapping the device isolation pattern, is the first edge portion. In still other embodiments, the gate electrode further comprises a third extending portion parallel to and facing the first extending portion, the first extending portion and the third extending portion are respectively connected to both ends of the second extending portion, and at least a portion of the third extending portion overlaps the device isolation pattern.

In yet other embodiments, the gate electrode further comprises a third extending portion facing the first extending portion and spaced apart from the first extending portion, and a fourth extending portion facing the second extending portion and spaced apart from the second extending portion, and the gate electrode has a closed loop shape in plan view. In yet other embodiments, at least one of the first, second, third or fourth extending portions comprises a landing portion for contacting the gate contact plug and a non-landing portion, and a width of the landing portion is greater than a width of the non-landing portion. In still other embodiments, a portion of an upper surface of the gate contact plug overlaps the device isolation pattern, and another portion of the upper surface of the first-gate contact plug overlaps the active region. In yet other embodiments, the entire upper surface of the gate contact plug overlaps the active region.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1A:
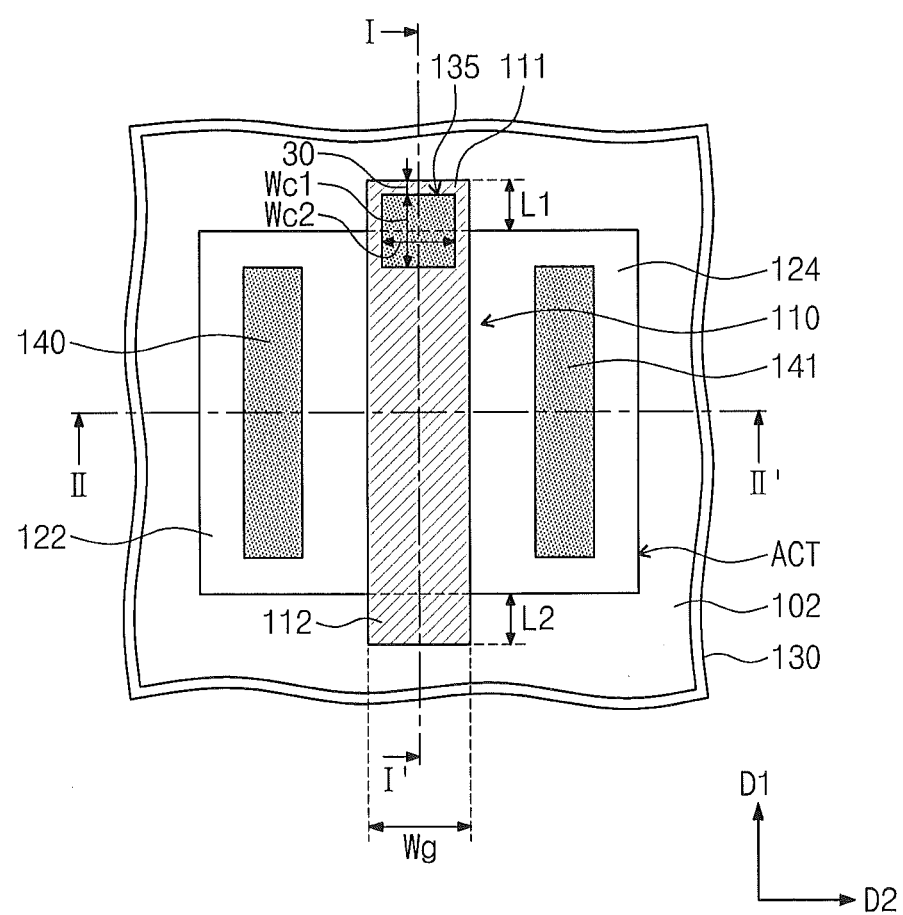
FIG. 1A is a plan view of an integrated circuit device according to various embodiments of the inventive concept.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scope of claims. Like reference numerals refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it can be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it can be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms may be used herein to describe one element's relationship to another element as illustrated in the Figures. These relative terms generally relate to an element's position relative to a substrate, when the substrate is at the bottom of a drawing. However, it will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below", "beneath" or "under" other elements would then be oriented "above" or "over" the other elements. The exemplary terms "below", "beneath", "under" "above" and "over" can, therefore, encompass both an orientation of above and below. Also, the terms "horizontal" and "vertical," and the terms "x", "y" and "z" are used herein to describe generally orthogonal directions and do not imply a specific orientation.

It also will be understood that, as used herein, the terms "row" or "horizontal" and "column" or "vertical" indicate two relative non-parallel directions that may be orthogonal to one another. However, these terms also are intended to encompass different orientations.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Embodiment 1

Figure 1B:
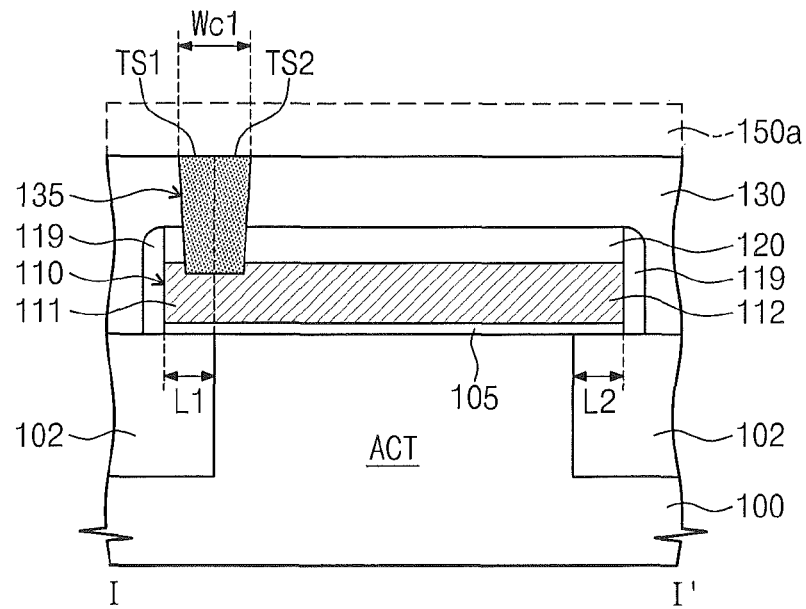
FIG. 1B is a cross-sectional view taken along line I-I' of FIG. 1A.
Figure 1C:
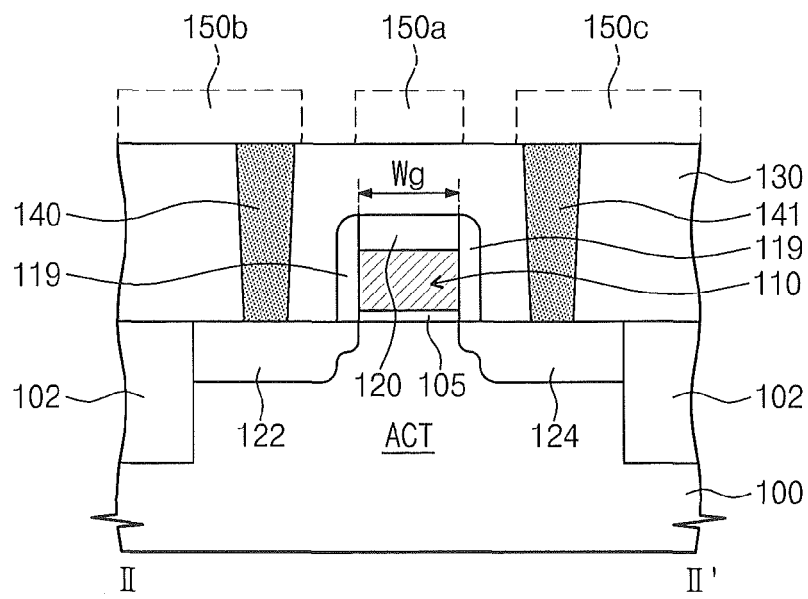
FIG. 1C is a cross-sectional view taken along line II-II' of FIG. 1A.

FIG. 1A is a plan view of an integrated circuit device according to various embodiments of the inventive concept, FIG. 1B is a cross-sectional view taken along line I-I' of FIG. 1A, and FIG. 1C is a cross-sectional view taken along line II-II' of FIG. 1A.

Referring to FIGS. 1A, 1B and 1C, a device isolation pattern 102 defining an active region ACT may be disposed in an integrated circuit substrate 100 such as a semiconductor substrate (hereinafter referred to as 'substrate'). The active region ACT may correspond to a portion of the substrate 100 enclosed by the device isolation pattern 102. The device isolation pattern 102 may be formed by using a trench type device isolation method. For example, the device isolation pattern 102 may fill a trench formed in the substrate 100. The substrate 100 may be a silicon substrate, a germanium substrate, a silicon-germanium substrate and/or various other microelectronic substrates including one or more layers. The device isolation pattern 102 may include oxide, nitride and/or oxynitride. The active region ACT may be doped with a first conductivity type dopant.

A gate electrode 110 is disposed over the active region ACT. As shown in FIG. 1A, the gate electrode 110 may extend in a first direction D1 parallel to an upper surface of the substrate 100 to cross the active region ACT in plan view. That is, the first direction D1 may be a longitudinal direction of the gate electrode 110. As shown in FIGS. 1B and 1C, a gate dielectric layer 105 may be disposed between the gate electrode 110 and the active region ACT. A capping dielectric pattern 120 may be disposed on the gate electrode 110. The capping dielectric pattern 120 may have a sidewall self-aligned with a sidewall of the gate electrode 110. The gate dielectric layer 110 may be a single layer or a multilayer formed of oxide, nitride, high k dielectric and/or oxynitride. The high k dielectric may have a higher dielectric constant than nitride. For example, the high k dielectric may include insulating metal oxides such as hafnium oxide, aluminum oxide, and/or the like. The capping dielectric pattern 120 may include oxide, nitride and/or oxynitride. The capping dielectric pattern 120 and the gate electrode 110 may be formed by using a mask pattern (not shown) defining the gate electrode 110.

The gate electrode 110 may be formed of a conductive material. For example, the gate electrode 110 may include semiconductor doped with a dopant (e.g., doped silicon, doped silicon-germanium, doped germanium and/or the like), metal (e.g., titanium, tantalum, tungsten, aluminum and/or the like), conductive metal nitride (e.g., titanium nitride, tantalum nitride and/or the like), and/or conductive metal-semiconductor compound (e.g., tungsten silicide, cobalt silicide, nickel silicide, titanium silicide and/or the like). The gate electrode 110 may be formed in a single layer or multilayer. According to an embodiment, the gate electrode 110 may include a doped semiconductor such as polysilicon and a conductive metal-semiconductor compound such as a metal silicide like tungsten silicide, sequentially stacked. In other embodiments, the gate electrode 110 may include a conductive metal nitride and a metal sequentially stacked. However, the present invention is not limited thereto. The gate electrode 110 may have a three-layer or more stack structure.

As disclosed in FIGS. 1A and 1B, the gate electrode 110 may include a first edge portion 111 overlapping the device isolation pattern 102. Additionally, the gate electrode 110 may include a second edge portion 112 positioned at an opposite side to the first edge portion 111. The second edge portion 112 may overlap another portion of the device isolation pattern 102 positioned at an opposite side to a portion of the device isolation pattern 102 overlapping the first edge portion 111. As shown in FIG. 1A, the gate electrode 110 may extend in the first direction D1 to cross both sides of the active region ACT which are parallel to a second direction D2. The second direction D2 may be perpendicular to the first direction D1, and may be parallel to the upper surface of the substrate 100. The first and second edge portions 111 and 112 may be connected to both ends of a portion overlapping the active region ACT of the gate electrode 110. The first edge portion 111 may have a first length L1 in the first direction D1 and the second edge portion 112 has a second length L2 in the first direction D1.

A first source/drain region 122 and a second source/drain region 124 may be disposed in the active regions ACT at both sides of the gate electrode 110, respectively. The first and second source/drain regions 122, 124 may be doped regions doped with a second conductivity type dopant. The second conductivity type dopant is different from the first conductivity type dopant. For example, one of the first conductivity type dopant or the second conductivity type dopant may be an n-type dopant and the other may be a p-type dopant. As shown in FIG. 1C, a gate spacer 119 may be disposed on sidewalls of the capping dielectric pattern 120 and gate electrode 110. The gate spacer 119 may be formed of oxide, nitride and/or oxynitride, and may be a single layer or multilayer. An interlayer dielectric layer 130 may be disposed over an entire surface of the substrate 100 including the gate electrode 110. The interlayer dielectric layer 130 may be formed of oxide, nitride and/or oxynitride and may be a single layer or multilayer.

A gate contact plug 135 may sequentially penetrate the interlayer dielectric layer 130 and the capping dielectric pattern 120 to contact the upper surface of the gate electrode 110. An entire lower surface of the gate contact plug 135 may contact the gate electrode 110. At least a portion of the gate contact plug 135 may overlap the active region ACT. In other words, at least a portion of the gate contact plug 135 may overlap the active region ACT in a direction vertical to the upper surface of the substrate 100.

According to an embodiment, as disclosed in FIGS. 1A and 1B, an upper surface of the gate contact plug 135 may include a first portion TS1 overlapping the device isolation pattern 102 and a second portion TS2 overlapping the active region ACT. In other words, a portion of the gate contact plug 135 may overlap the active region ACT and another portion of the gate contact plug 135 may overlap the device isolation pattern 102. As shown in FIG. 1B, the upper surface of the gate contact plug 135 may be wider than the lower surface thereof.

By doing so, a sidewall of the gate contact plug 135 may have an inclination structure. The first portion TS1 of the upper surface of the gate contact plug 135 may overlap the first edge portion 111.

The upper surface of the gate contact plug 135 has a first width Wc1 in the first direction D1 and a second width Wc2 in the second direction D2. At this time, the first length L1 of the first edge portion 111 of the gate electrode 110 may be smaller than a sum of the first width Wc1 and a horizontal distance 30 between an end of the gate contact plug 135 overlapping the device isolation pattern 102 and an end of the first edge portion 111. The horizontal distance 30 may be a distance between an end of the first portion TS1 of the upper surface of the gate contact plug 135 and the end of the first edge portion 111 in the first direction D1. The first length L1 is greater than zero (0). The end of the first edge portion 111 may correspond to an end of the gate electrode 110. According to an embodiment, the horizontal distance 30 may be about 5% to about 15% of the first width Wc1. According to an embodiment, the first length L1 of the first edge portion 111 may be smaller than the first width Wc1.

If a gate contact plug contacting a gate electrode completely overlaps a device isolation pattern, a width of an active region, in a longitudinal direction of the gate electrode, may be small in a given area. But, according to the above embodiments of the inventive concept, the width of the active region ACT in the first direction D1 can increase until the active region ACT overlaps at least a portion of the gate contact plug 135 when a length of the gate electrode 110 in the first direction D1, according to embodiments of the inventive concept, may be the same as a length of the gate electrode having the gate contact plug completely overlapping the device isolation pattern. A channel region may be defined in the active region ACT below the gate electrode 110. The width of the active region ACT in the first direction D1 corresponds to a channel width of the channel region. As the width of the active region ACT in the first direction D1 increases, the channel width increases. Therefore, the amount of turn-on current of a field effect transistor (hereinafter referred to as 'transistor') including the gate electrode 110 can increase. As a result, a device which is configured for high integration and has superior reliability can be realized.

If the gate contact plug completely overlaps the device isolation pattern, a length of an edge portion of the gate electrode, overlapping the device isolation pattern, may be greater than a sum of the first width Wc1 and the horizontal distance 30, such that a width of the active region in the longitudinal direction of the gate electrode decreases. In this case, the channel width of the transistor decreases and thus the amount of turn-on current of the transistor decreases.

However, as aforementioned, according to various embodiments of the inventive concept, at least a portion of the gate contact plug 135 overlaps the active region ACT. Therefore, the first length L1 may be smaller than a sum of the first width Wc1 and the horizontal distance 30. As a result, the width of the active region ACT in the first direction D1 can increase in the given area, such that the amount of turn-on current of the transistor increases. Therefore, the device can be improved or optimized for high integration and can have superior reliability.

According to some embodiments, the second length L2 of the second edge portion 112 may be smaller than the sum of the first width Wc1 and the horizontal distance 30. More concretely, the second length L2 of the second edge portion 112 may be smaller than the first width We1. By doing so, the width of the active region ACT in the first direction D1 can be further increased. Of course, the second length L2 is greater than zero (0).

In FIG. 1A, the upper surface of the gate contact plug 135 is shown in a rectangular shape. However, the present invention is not limited thereto. By an exposure effect of a photolithography process and/or design of layout, the upper surface of the gate contact plug 135 may have a polygonal, circular and/or elliptical shape in plan view. According to an embodiment, when the upper surface of the gate contact plug 135 has a circular and/or elliptical shape, the first width Wc1 of the gate contact plug 135 may correspond to a maximum width in the first direction D1.

According to some embodiments, as shown in FIG. 1A, the width Wg of the gate electrode 110 in the second direction D2 may be substantially uniform. In this case, to secure a margin for misalignment in the second direction D2 of the gate contact plug 135, the width Wg of the gate electrode 110 may be greater than the second width Wc2 of the gate contact plug 135. For example, the width Wg of the gate electrode 110 may be about 110% to about 130% of the second width Wc2 of the gate contact plug 135. The width Wg of the gate electrode 110 may correspond to the channel length of the channel generated in the channel region.

The gate contact plug 135 may be formed of a conductive material. For example, the gate contact plug 135 may include metals (e.g., tungsten, tantalum, titanium and/or copper) and conductive metal nitrides (e.g., titanium nitride, tantalum nitride). In some embodiments, when the gate includes a metal silicide layer such as tungsten silicide, the gate contact plug comprises the metal, such as tungsten. According to some embodiments, another gate contact plug may be provided on the gate electrode 110. The other gate contact plug may have the same size and/or shape as the gate contact plug 135. The other gate contact plug may be laterally spaced apart from the gate contact plug 135. At least a portion of the other gate contact plug may overlap the active region ACT. The other gate contact plug may partially contact the second edge portion 112 or completely overlaps the active region ACT.

Referring to FIGS. 1A and 1C, a first source/drain-contact plug 140 and a second source/drain-contact plug 141 may penetrate the interlayer dielectric layer 130 to contact the first source/drain 122 and the second source/drain 124, respectively. Upper surfaces of the first source/drain-contact plug 140 and second source/drain-contact plug 141 may have a bar shape extending in parallel along the first direction D1. Due to this, a shortest distance between a central portion of the channel region and the source/drain-contact plugs 140, 141 may be substantially the same as a shortest distance between an edge of the channel region and the source/drain-contact plugs 140, 141. As a result, the amount of turn-on current of the transistor can be increased.

As disclosed in FIGS. 1B and 1C, the upper surface of the gate contact plug 135 may be coplanar with the upper surface of the interlayer dielectric layer 130. Upper surfaces of the source/drain-contact plugs 140, 141 may be coplanar with the upper surface of the interlayer dielectric layer 130. Therefore, the upper surface of the gate contact plug 135 may be positioned substantially at the same level as the upper surfaces of the source/drain-contact plugs 140, 141. However, the present invention is not limited thereto. The upper surfaces of the source/drain-contact plugs 140, 141 may be positioned at a lower level or higher level than the upper surface of the gate contact plug 135. The source/drain-contact plugs 140, 141 may be formed of a conductive material. For example, the source/drain-contact plugs 140, 141 may include metal (e.g., tungsten, tantalum, titanium and/or copper) and/or conductive metal nitride (e.g., titanium nitride and/or tantalum nitride). According to some embodiments, the source/drain-contact plugs 140, 141 may be formed of the same material as the gate contact plug 135.

As disclosed in FIGS. 1B and 1C, a first interconnection 150a, a second interconnection 150b and a third interconnection line 150c may be disposed on the interlayer dielectric layer 130. The first interconnection line 150a may be connected to the gate contact plug 135. The second interconnection line 150b may be connected to the first source/drain-contact plug 140, and the third interconnection line 150c may be connected to the second source/drain-contact plug 141. The first, second and third interconnection lines 150a, 150b and 150c may be implemented in various shapes according to characteristics desired for the device. According to some embodiments, the transistors shown in FIGS. 1A, 1B and 1C may be implemented as transistors (e.g., transistors of a peripheral circuit) performing various uses and/or various functions desired for the device.

Next, modified examples of integrated circuit devices according to various embodiments will be described with reference to the accompanying drawings.

Figure 2A:
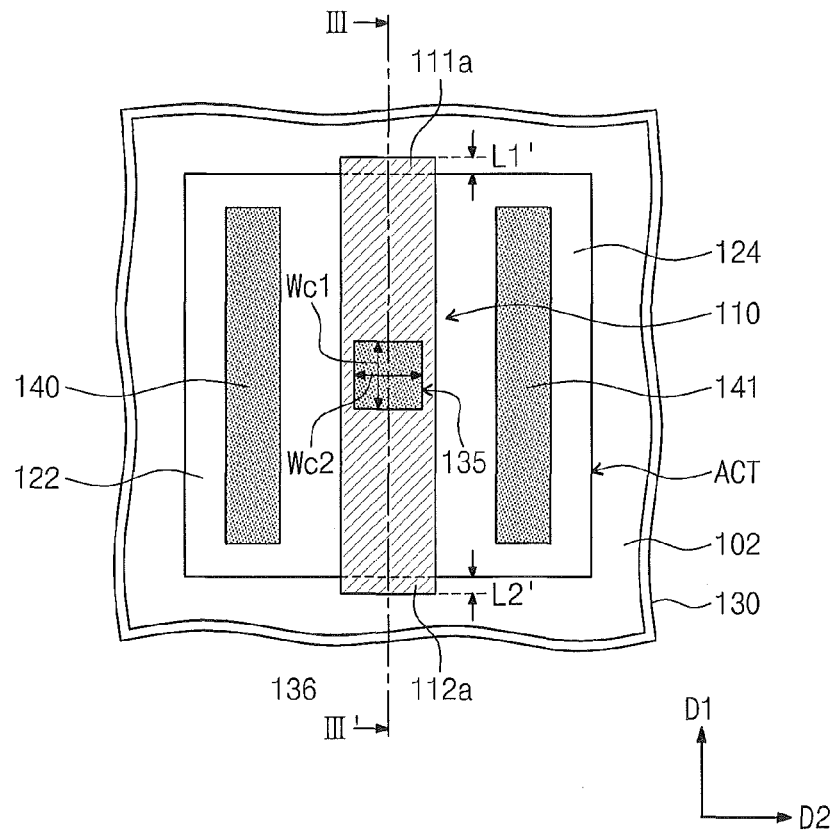
FIG. 2A is a plan view illustrating a modified example of an integrated circuit device according to embodiments of the inventive concept.
Figure 2B:
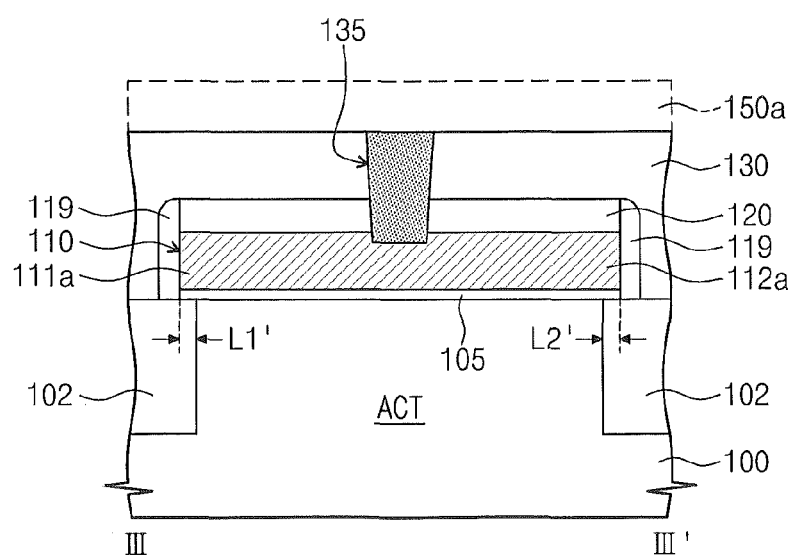
FIG. 2B is a cross-sectional view taken along line III-III' of FIG. 2A.

FIG. 2A is a plan view illustrating a modified example of an integrated circuit device according to an embodiment of the inventive concept, and FIG. 2B is a cross-sectional view taken along line III-III' of FIG. 2A.

Referring to FIGS. 2A and 2B, a gate contact plug 135 may completely overlap the active region ACT. That is, the entire upper surface of the gate contact plug 135 may overlap the active region ACT. The gate electrode 110 includes a first edge portion 111a overlapping the device isolation pattern 102. At this time, a first length L1' of the first edge portion 111a in the first direction D1 may be smaller than a first width Wc1 of the gate contact plug 135 in the first direction D1. The first length L1' of the first edge portion 111a is greater than zero (0). The gate electrode 110 may further include a second edge portion 112a. The second edge portion 112a is positioned at an opposite side to the first edge portion 111a and overlaps the device isolation pattern 102. The second length L2' of the second edge portion 112a in the first direction D1 may be smaller than the first width Wc1 of the gate contact plug 135. The second length L2' of the second edge portion 112a is also greater than Zero (0).

According to the present modified example, the entire upper surface of the gate contact plug 135 overlaps the active region ACT and the first length L1' of the first edge portion 111a may be smaller than the first width Wc1 of the gate contact plug 135. Also, the second length L2' of the second edge portion 112a may be also smaller than the first width Wc1. Therefore, the width of the active region ACT in the first direction D1 can be further increased.

Figure 3A:
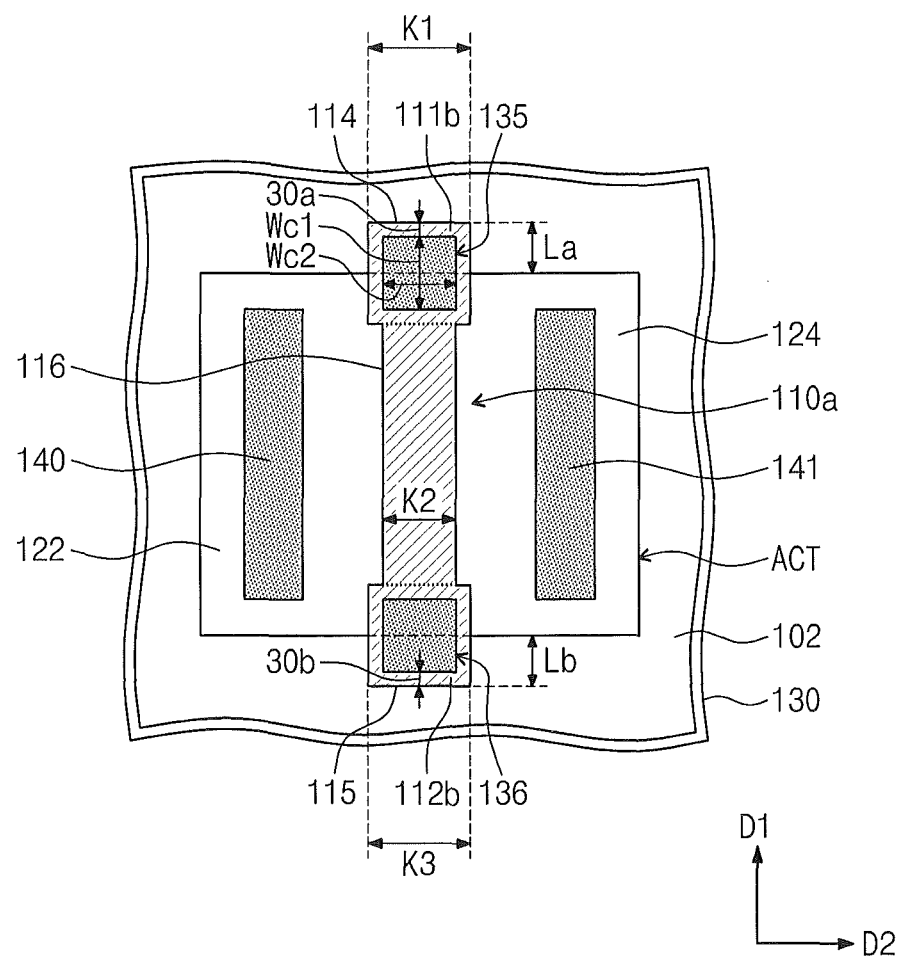
FIG. 3A is a plan view illustrating another modified example of an integrated circuit device according to other embodiments of the inventive concept.
Figure 3B:
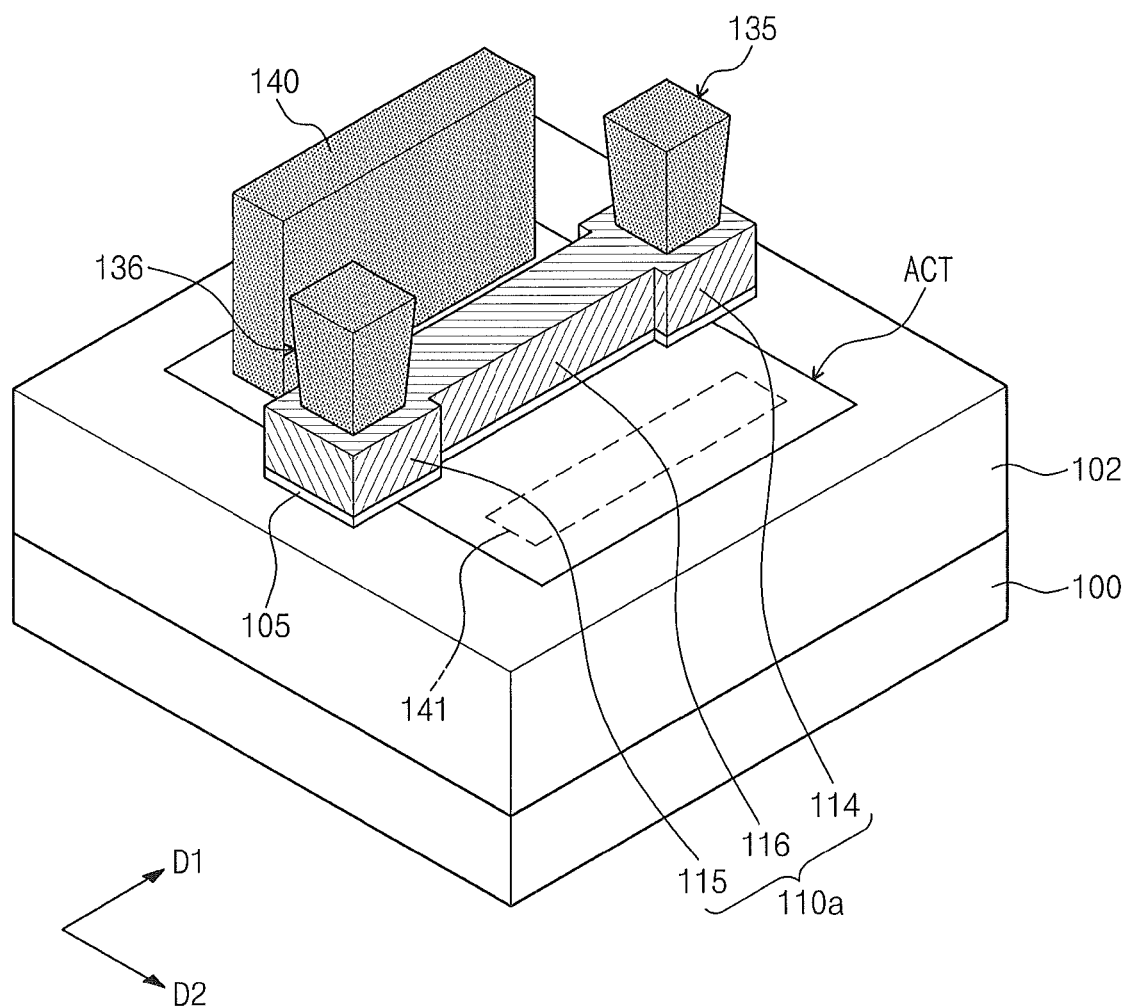
FIG. 3B is a perspective view for illustrating the gate electrode included in the device of FIG. 3A.

FIG. 3A is a plan view illustrating another modified example of an integrated circuit device according to an embodiment of the inventive concept, and FIG. 3B is a perspective view for illustrating the gate electrode included in the device of FIG. 3A. For description of the gate electrode in FIG. 3B, the interlayer dielectric layer 130, the capping dielectric pattern 120, the spacer 119 and the first source/drain-contact plug 140 are omitted.

Referring to FIGS. 3A and 3B, a gate electrode 110a may extend in a first direction D1 to cross over an active region ACT. The gate electrode 110a may include a first landing portion 114, a non-landing portion 116 and a second landing portion 115. The first and second landing portions 114 and 115 may be connected to both ends of the non-landing portion 116, respectively. The second landing portion 115, the non-landing portion 116 and the first landing portion 114 may be arranged sequentially along the first direction D1. A first gate contact plug 135 may contact the first landing portion 114 and a second gate contact plug 136 may contact the second landing portion 115. The gate contact plugs 135 and 136 may not contact the non-landing portion 116. That is, the first and second landing portions 114 and 115 of the gate electrode 110a may be portions for contacting the gate contact plugs 135 and 136. In FIG. 3B, the first and second gate contact plugs 135 and 136 are shown in a square pillar shape. However, the present invention is not limited thereto. The first and second gate contact plugs 135 and 136 may be implemented in another shape (e.g., cylindrical shape, elliptic cylindrical shape and/or the like). A gate dielectric layer 105 may be disposed between the gate electrode 110a and the active region ACT. Also, the capping dielectric pattern 120 of FIGS. 1A, 1B and 1C may be disposed on the gate electrode 110a. The gate electrode 110a may be formed of the same material as the gate electrode 110 of FIGS. 1A, 1B and 1C.

The first landing portion 114 has a first width K1 in a second direction D2 perpendicular to the first direction D1, and the non-landing portion 116 has a second width K2 in the second direction D2. At this time, the first width K1 of the first landing portion 114 may be greater than the second width K2 of the non-landing portion 116. Likewise, a third width K3 of the second landing portion 115 in the second direction D2 may be greater than the second width K2 of the non-landing portion 116. The first width K1 of the first landing portion 114 may be equal to the third width K3 of the second landing portion 116. The first gate contact plug 135 has a first width Wc1 in the first direction D1 and a second width Wc2 in the second direction D2. To secure a margin for misalignment of the first gate contact plug 135, the first width K1 of the first landing portion 114 may be greater than the second width Wc2 of the first gate contact plug 135. For example, the first width K1 of the first landing portion 114 may be about 110% to about 130% of the second width Wc2 of the first gate contact plug 135. Likewise, the third width K3 of the second landing portion 115 may be greater than a width of the second gate contact plug 136 in the second direction D2. The widths Wc1, Wc2 of the first gate contact plug 135 may be respectively equal to the widths of the second gate contact plug 136 corresponding thereto. Therefore, the third width K3 of the second landing portion 115 may be about 110% to 130% of the second width Wc2 of the first gate contact plug 135.

The first landing portion 114 may overlap some portion of the device isolation pattern 102 and some portion of the active region ACT adjacent thereto. Also, the upper surface of the first gate contact plug 135 may also overlap some portion of the device isolation pattern 102 and some portion of the active region ACT adjacent thereto. At this time, the portion 111b of the first landing portion 114 overlapping the device isolation pattern 102 may have a first length La in the first direction D1. The first length La may be smaller than a sum of the first width Wc1 and a first horizontal distance 30a. The first horizontal distance 30a may be a horizontal distance in the first direction D1 between one end of the first gate contact plug 135 overlapping the device isolation pattern 102 and one end of the portion 111b of the first landing portion 114. The portion 111b of the first landing portion 114 overlapping the device isolation pattern 102 may correspond to a first edge portion of the gate electrode 110a overlapping the device isolation pattern 102. The first length La is greater than zero (0). For example, the first horizontal length 30a may be about 5% to about 15% of the first width Wc1. According to an embodiment, the first length La may be smaller than the first width Wc1.

Similarly to this, the second landing portion 115 may overlap another portion of the device isolation pattern 102 and another portion of the active region ACT adjacent thereto. Also, a portion of the upper surface of the second gate contact plug 136 may overlap the device isolation pattern 102 and another portion may overlap the active region ACT. A portion 112b of the second landing portion 115 overlapping the device isolation pattern 102 may have a second length Lb in the first direction D1. The second length Lb may be smaller than a sum of a width of the second gate contact plug 136 in the first direction D1 and a second horizontal distance 30b. The second horizontal distance 30b may be a horizontal distance in the first direction D1 between one end of the second gate contact plug 136 overlapping the device isolation pattern 102 and one end of the portion 112b of the second landing portion 115. The portion 112b of the second landing portion 115 overlapping the device isolation pattern 102 may correspond to a second edge portion overlapping the device isolation pattern 102 of the gate electrode 110a. The second length Lb is greater than zero (0). For example, the second horizontal distance 30b may be about 5% to about 15% of the width of the second gate contact plug 136 in the first direction D1. According to some embodiments, the second length Lb may be smaller than the width of the second gate contact plug 136 in the first direction D1.

The widths K1, K2 and K3 of the first landing portion 114, non-landing portion 116 and second landing portion 115 may correspond to channel lengths of a channel region defined below the gate electrode 110a. As aforementioned, the widths of the first and second landing portions 114 and 115 may be greater than the width K2 of the non-landing portion 116. Therefore, the channel lengths below the landing portions 114 and 115 may be greater than the channel length below the non-landing portion 116. According to the present modified example, since each of the first and second landing portions 114 and 115 overlaps the device isolation pattern 102 and the active region ACT, the first and second landing portions 114 and 115 may cover some portions of a boundary of the device isolation pattern 102 and the active region ACT.

The channel region defined below the gate electrode 110a may include first portions and a second portion. The first portions of the channel region are adjacent to the boundary and are covered by the landing portions 114 and 115, and the second portion of the channel region is covered by the non-landing portion 116. In the case where an operation voltage is applied to the gate electrode 110a, an electric field may be concentrated on the boundary. In other words, the intensity of a first electric field provided to the first portion of the channel region by the operation voltage may be greater than that of a second electric field provided to the second portion of the channel region. Due to this, the first portion of the channel region may be turned on before the second portion of the channel region is turned on, so that leakage current may be generated. However, according to the present modified example, the channel length below the landing portions 114 and 115 is longer than the channel length below the non-landing portion 116. Therefore, the resistance of the first portion of the channel region may be greater than the resistance of the second portion of the channel region and thus leakage current through the first portions of the channel region may be minimized by the landing portions 114 and 115. As a result, since the landing portions 114 and 115 and the gate contact plugs 135 and 136 partially overlap the active region ACT, the amount of turn-on current of the transistor within a given area can be increased, and since the landing portions 114 and 115 cover the boundary, leakage current of the transistor can be reduced or minimized.

Figure 4:
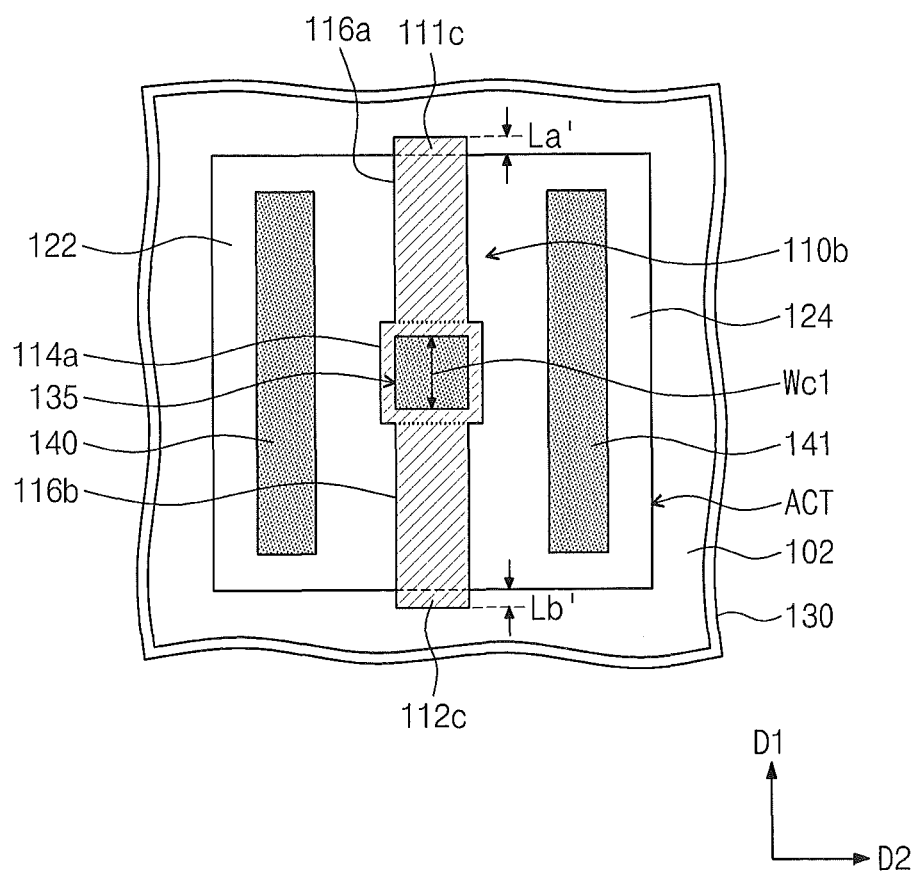
FIG. 4 is a plan view illustrating another modified example of an integrated circuit device according to other embodiments.

FIG. 4 is a plan view illustrating another modified example of an integrated circuit device according to other embodiments.

Referring to FIG. 4, a gate electrode 110b may extend in a first direction D1 to cross over an active region ACT. A gate dielectric layer (see 105 of FIGS. 1B and 1C) may be disposed between the gate electrode 110b and the active region ACT, and a capping dielectric pattern (see 120 of FIGS. 1B and 1C) may be disposed on the gate electrode 110b.

The gate electrode 110b may include a landing portion 114a and non-landing portions 116a and 116b. According to the present modified example, the landing portion 114a may completely overlap the active region ACT. That is, a whole of the landing portion 114a may overlap the active region ACT. Therefore, a gate contact plug 135 contacting an upper surface of the landing portion 114a may completely overlap the active region ACT. The landing portion 114a may be disposed between a first non-landing portion 116a and a second non-landing portion 116b. The gate electrode 110b may include a first edge portion 111c and a second edge portion 112c which overlap the device isolation pattern 102. The first edge portion $111_c$ may be a portion of the first non-landing portion 116a and the second edge portion 112c may be a portion of the second non-landing portion 116b. The first edge portion 111c may have a first length La' in the first direction D1 and the second edge portion 112c may have a second length Lb' in the first direction D1. As the landing portion 114a completely overlaps the active region ACT, the first length La' of the first edge portion 111c of the gate electrode 110b may be smaller than a width Wc1 of the gate contact plug 135 in the first direction. Likewise, the second length Lb' of the second edge portion 112c of the gate electrode 110b may be smaller than the width Wc1 of the gate contact plug 135.

According to the present modified example, an entire region of the landing portion 114a may overlap the active region ACT. Therefore, the first and second lengths La' and Lb' may be smaller than the width Wc1 of the gate contact plug 135. As a result, the width of the active region ACT in the first direction D1 within a given area is increased and thus the channel width of the transistor within the given area can be increased.

According to an embodiment, prior to forming the gate electrode 110b, dopant ions for controlling the threshold voltage of the transistor may be selectively implanted into an edge portion of the active region ACT adjacent to the boundary between the device isolation pattern 102 and the active region ACT. At this time, the dopant ions for controlling the threshold voltage may not be implanted into a central portion of the active region ACT. Accordingly, the threshold voltage of the first portion of the channel region adjacent to the boundary and the threshold voltage of the second portion of the channel region defined at a central portion of the active region ACT may be different. By doing so, the leakage current due to the concentration of the electric field on the boundary can be reduced or minimized. That is, an absolute value of the threshold voltage of the first portion of the channel region is made greater than an absolute value of the threshold voltage of the second portion of the channel region, thereby allowing the reducing or minimizing of the leakage current through the first portion of the channel region.

Additional discussion of various embodiments of the inventive concept as illustrated in FIGS. 1A-4 and as described herein, will now be provided. Specifically, various embodiments of FIGS. 1A-4 can provide an integrated circuit field effect transistor that comprises an integrated circuit substrate 100, an isolation region 102 in the integrated circuit substrate that defines an active region ACT, and spaced apart source and drain regions 122 and 124 in the active region. A gate electrode 110, 110a, 110b may be provided on the active region ACT between the spaced apart source and drain regions 122 and 124. The gate electrode extends across the active region ACT and onto the isolation region 102, and includes therein a landing pad 114, 115 that is wider than a non-landing pad portion 116 of the gate electrode 110. A gate contact plug 135, 136 electrically contacts the gate electrode 110, 110a, 110b at the landing pad 114, 115, wherein the landing pad at least partially overlaps the active region ACT and wherein the gate contact plug at least partially overlaps the active region ACT. In other embodiments, the landing pad 114, 115 may also at least partially overlap the isolation region 102 and/or the gate contact plug 135, 136 may also partially overlap the isolation region 102. A single landing pad and a single gate contact plug may be provided in some embodiments (e.g., FIG. 4). In other embodiments, first and second landing pads and corresponding first and second gate contacts may be provided, for example at opposite ends of the gate electrode (e.g., FIGS. 3A-3B).

In some embodiments, the gate electrode 110 including the landing pad(s) comprises a first layer comprising polysilicon adjacent the substrate 100 and a second layer comprising metal silicide on the first layer comprising polysilicon, and a gate contact plug 135, 136 comprising the metal directly contacts the second layer comprising metal silicide. In other embodiments, the metal comprises tungsten.

Integrated circuit field effect transistors according to other embodiments of FIGS. 1A-4 include an integrated circuit substrate 100, an isolation region 102 in the integrated circuit substrate that defines an active region ACT and spaced apart source and drain regions 122, 124 in the active region ACT. A gate electrode 110, 110a is provided on the active region between the spaced apart source and drain regions 122, 124. The gate electrode 110, 110a extends across the active region and into the isolation region. A gate contact plug 135, 136 electrically contacts the gate electrode and at least partially overlaps the active region. The gate electrode comprises a first layer comprising polysilicon adjacent the substrate and a second layer comprising metal silicide on the first layer comprising polysilicon. The gate contact plug 135, 136 comprises the metal and directly contacts the second layer comprising metal silicide. In some embodiments, the metal comprises tungsten and/or the gate contact plug can fully overlap the active region. In still other embodiments, a gate electrode 110, 110a is provided on the active region between the spaced apart source and drain regions 122, 124, the gate electrode extending across the active region ACT and onto the isolation region 102. A gate contact plug 135, 136 electrically contacts the gate electrode. The gate contact plug 135, 136 partially overlaps the isolation region 102 and partially overlaps the active region ACT.

Figure 10A:
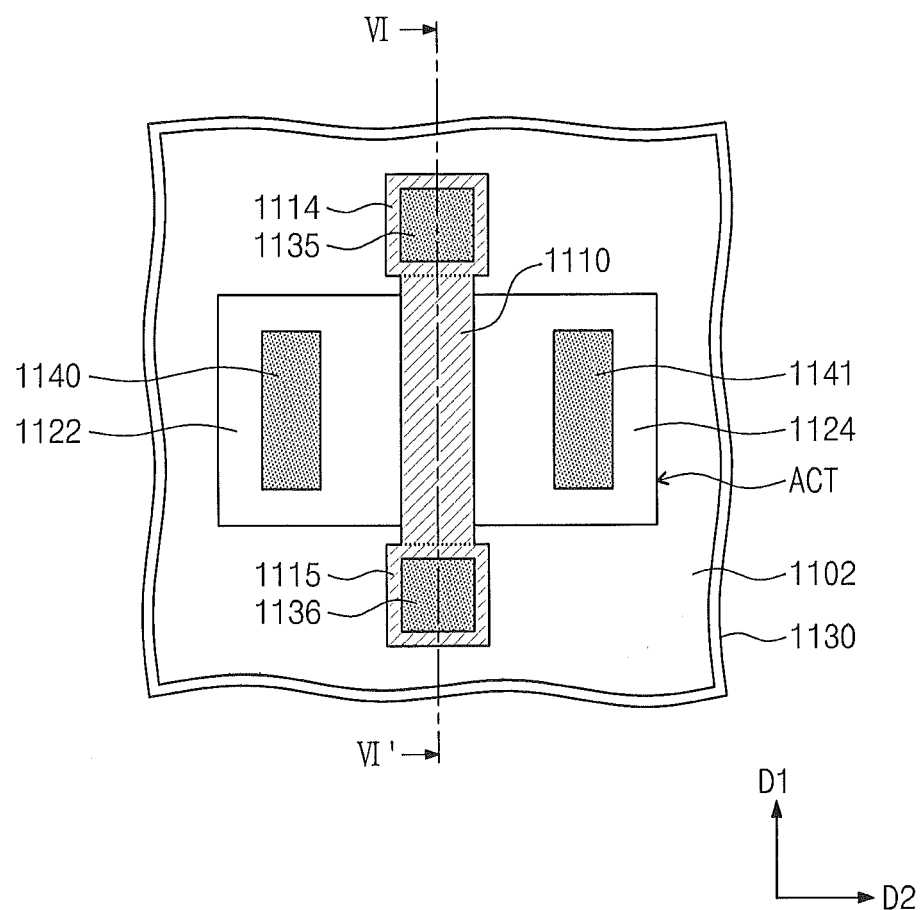
FIG. 10A is a plan view of a conventional integrated circuit device.
Figure 10B:
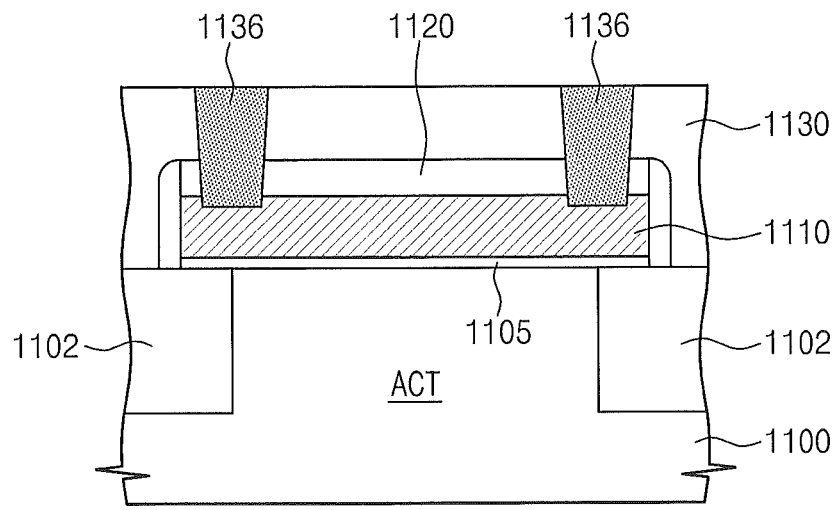
FIG. 10B is a cross-sectional view taken along line VI-VI' of FIG. 10A.

Various embodiments described above may arise from recognition that conventional devices illustrated in FIGS. 10A and 10B may include an isolation region 1102 in an integrated circuit substrate 1100 that defines spaced apart first and second source/drain regions 1122/1124, a gate electrode 1110 that extends across the active region ACT onto the isolation region 1102, and a source contact and a drain contact 1140 and 1141, respectively. First and second landing pads 1114, 1115 may be provided on the isolation region 1102 that does not extend over the active region ACT. More specifically, when gate polysilicon 1110 is provided on a gate dielectric layer 1105 and a tungsten (or other metal) silicide layer 1120 is provided on the gate polysilicon layer 1110, the tungsten silicide material 1120 must be removed, and one or more polysilicon gate contact plugs 1135, 1136 are provided that penetrate through the tungsten silicide 1120 to directly contact the gate polysilicon layer 1110. However, a chemical solution for removing the tungsten silicide 1120 penetrates the gate insulating layer 1105 through the grain boundaries of the gate polysilicon 1110 and deteriorates the gate oxide 1105. Accordingly, conventionally, it is forbidden to place the polysilicon gate contact plugs 1135, 1136 over the active region ACT. Rather, the gate contact plugs 1135, 1136 are placed over the isolation region 1102. Stated differently, the active region ACT is not allowed to overlap with the gate contact plugs 1135, 1136. This may cause the transistor width to shrink, which may limit the drive current thereof.

However, according to some embodiments described herein in connection with FIGS. 1A-4, the gate contact plugs do not comprise polysilicon but, rather, comprise the metal of the metal silicide layer. Thus, the metal silicide layer need not be etched to form a gate contact plug and the gate contact plug need not directly contact the gate polysilicon layer. Accordingly, the gate contact plug(s) can be made to at least partially, and in some embodiments fully, overlap the active region. The active region can, therefore, increase in width, which can allow greater drive currents, higher reliability and/or higher integration.

Embodiment 2

Figure 5A:
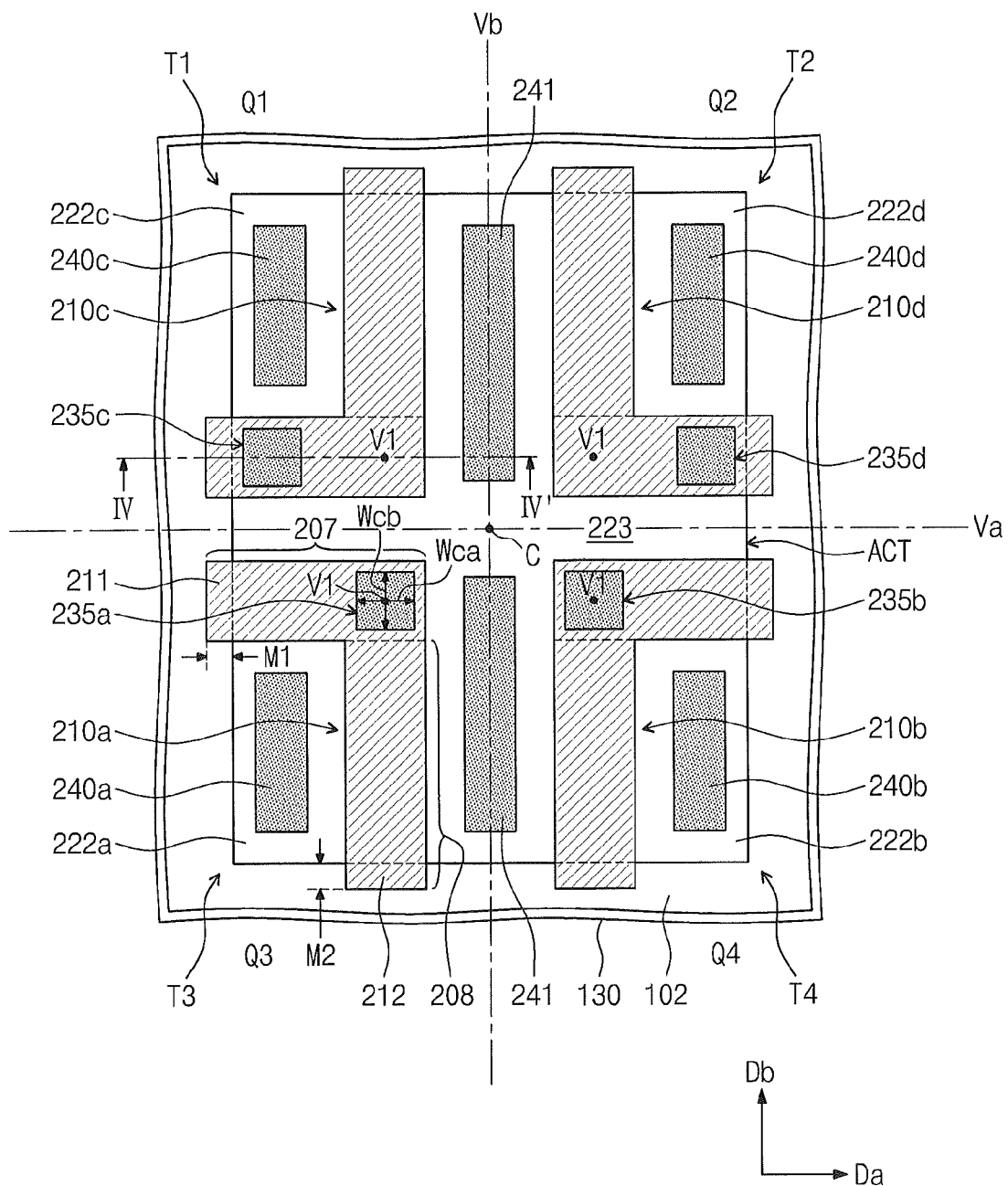
FIG. 5A is a plan view of an integrated circuit device according to other embodiments of the inventive concept.
Figure 5B:
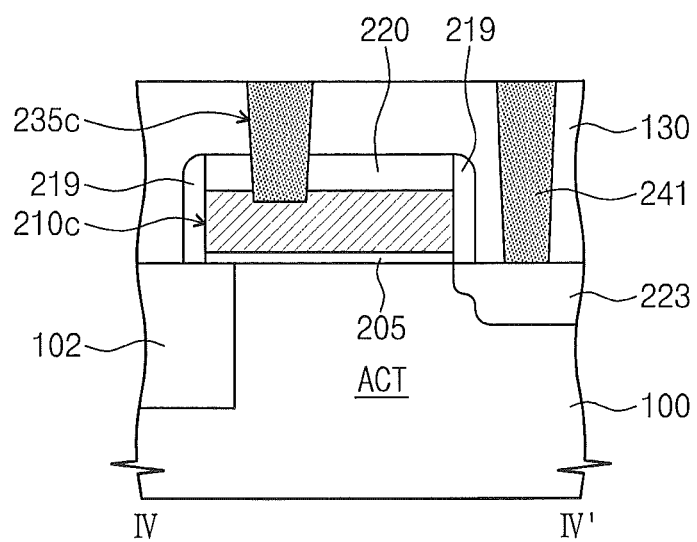
FIG. 5B is a cross-sectional view taken along line IV-IV' of FIG. 5A.

FIG. 5A is a plan view of an integrated circuit device according to other embodiments of the inventive concept, and FIG. 5B is a cross-sectional view taken along line IV-IV' of FIG. 5A.

Referring to FIGS. 5A and 5B, a device isolation pattern 102 defining an active region ACT is disposed in a substrate 100. A first gate electrode 210a may be disposed over the active region ACT. The active region ACT may correspond to a portion of the substrate 100 enclosed by the device isolation pattern 102, and may be doped with a first conductivity type dopant. As shown in FIG. 5A, the first gate electrode 210a may include a first extending portion 207 extending in a first direction Da and a second extending portion 208 extending in a second direction Db which is different from the first direction Da. The first and second directions Da and Db are parallel to an upper surface of the substrate 100. The second direction Db may be perpendicular to the first direction Da.

The first and second extending portions 207 and 208 of the first gate electrode 210a may be connected to each other over the active region ACT. As shown in FIG. 5A, the first extending portion 207 may include a first edge portion 211 overlapping some portion of the device isolation pattern 102. The first edge portion 211 of the first extending portion 207 may overlap a portion of the device isolation pattern 102 adjacent to one side of the active region ACT parallel to the second direction Db. The second extending portion 208 may include a second edge portion 212 overlapping another portion of the device isolation pattern 102. The second edge portion 212 of the second extending portion 208 may overlap another portion of the device isolation pattern 102 adjacent to another side of the active region ACT parallel to the first direction Da. The first edge portion 211 of the first gate electrode 210a may have a first length M1 in the first direction Da, and the second edge portion 212 of the first gate electrode 210a may have a second length M2 in the second direction Db.

A channel region may be defined in the active region ACT below the first gate electrode 210a. The channel region may include a first sub region positioned below the first extending portion 207 and a second sub region positioned below the second extending portion 208. A channel width of the channel region may be equal to a sum of a channel width of the first sub region in the first direction Da and a channel width of the second sub region in the second direction Db. The channel region may have a channel length in several directions. For example, the first sub region may have a first channel length corresponding to the width of the first extending portion 207 in the second direction Db, and the second sub region may have a second channel length corresponding to the width of the second extending portion 208 in the first direction Da. That is, the first and second channel lengths may extend in different directions.

A second gate electrode 210b may be disposed spaced apart from the first gate electrode 210a in the first direction Da. A third gate electrode 210c may be disposed spaced apart from the first gate electrode 210a in the second direction Db. A fourth gate electrode 210d may be disposed spaced apart from the third gate electrode in the first direction Da. In other words, the first, second, third and fourth gate electrodes 210a, 210b, 210c and 210d may be arranged two-dimensionally along a row direction and a column direction on one active region ACT. The row direction is perpendicular to the column direction. The row direction may be parallel to the first direction Da and the column direction may be parallel to the second direction Db. The first, second, third and fourth gate electrodes 210a, 210b, 210c and 210d may be spaced apart from one another. According to an embodiment, the second gate electrode 210b may have a substantially symmetric structure to the first gate electrode 210a with respect to a first virtual straight line Vb passing through a central point C of the active region ACT and extending in the second direction Db. The third gate electrode 210c may have a substantially symmetric structure to the first gate electrode 210a with respect to a second virtual straight line Va passing through the central point C and extending in the first direction Da. The fourth gate electrode 210d may have a substantially symmetric structure to the third gate electrode 210c with respect to the first virtual straight line Vb. In other words, the second gate electrode 210b may have a substantially symmetric structure to the first gate electrode 210a in the row direction. The third gate electrode 210c may have a substantially symmetric structure to the first gate electrode 210a in the column direction. The fourth gate electrode 210d may have a substantially symmetric structure to the third gate electrode 210c in the row direction.

As disclosed in FIG. 5B, a gate dielectric layer 205 may be disposed between the active region ACT and the gate electrodes 210a, 210b, 201c, 210d. A capping dielectric pattern 220 may be disposed on each of the gate electrodes 210a, 210b, 210c and 210d. A gate spacer 219 may be disposed on sidewalls of the gate electrodes 210a, 210b, 210c and 210d. A source region 223 may be disposed in the active region ACT between the first, second, third and fourth gate electrodes 210a, 210b, 210c and 210d. As shown in FIG. 5A, the source region 223 may have a "+" shape in plan view. A first drain region 222a may be disposed in the active region ACT at one side of the first gate electrode 210a opposite to the source region 223, and a second drain region 222b may be disposed in the active region ACT at one side of the second gate electrode 210b opposite to the source region 223. A third drain region 222c may be disposed in the active region ACT at one side of the third gate electrode 210c opposite to the source region 223, and a fourth drain region 222d may be disposed in the active region ACT at one side of the fourth gate electrode 210d opposite to the source region 223. The source region 223 and the drain regions 222a, 222b, 222c and 222d may be doped with a second conductivity type dopant. The first, second, third and fourth gate electrodes 210a, 210b, 210c and 210d may be included in a first transistor, a second transistor, a third transistor and a fourth transistor, respectively. The first, second, third and fourth transistors may share the source region 223. The gate dielectric layer 205, the capping dielectric pattern 220 and the gate spacer 219 may be formed of the same materials as the gate dielectric layer 105, the capping dielectric pattern 120 and the gate spacer 119 disclosed in FIGS. 1B and 1C, respectively. The gate electrodes 210a, 210b, 210c and 210d may be formed of the same material as the gate electrode 110 of FIGS. 1A, 1B and 1C.

An interlayer dielectric layer 130 may be disposed over an entire surface of the substrate 100 including the gate electrodes 210a, 210b, 210c and 210d. A first gate contact plug 235a penetrates the interlayer dielectric layer 130 to contact the first gate electrode 210a. At this time, at least a portion of the first gate contact plug 235a may overlap the active region ACT. The first gate contact plug 235a may sequentially penetrate the interlayer dielectric layer 130 and the capping dielectric pattern 220 on the first gate electrode 210a to contact the first gate electrode 210a. An upper surface of the first gate contact plug 235a has a first width Wca in the first direction Da and a second width Wcb in the second direction Db.

As shown in FIG. 5A, according to an embodiment, an entire region of the first gate contact plug 235a may overlap the active region ACT. In this case, the first length M1 of the first edge portion 211 of the first gate electrode 210a may be smaller than the first width Wca of the first gate contact plug 235a. The second length M2 of the second edge portion 212 of the first gate electrode 210a may be smaller than the second width Wcb of the first gate contact plug 235a.

Alternatively, according to other embodiments, a first portion of the first gate contact plug 235a may contact the first edge portion 211 and a second portion of the first gate contact plug 235a may overlap the active region ACT adjacent to the first edge portion 211. In this case, the first length M1 of the first edge portion 211 may be smaller than a sum of the first width Wca and a horizontal distance in the first direction Da between one end of the first edge portion 211 on the device isolation pattern 102 and one end of the first gate contact plug 235a overlapping the device isolation pattern 102. The horizontal distance in the first direction Da may be about 5% to about 15% of the first width Wca. The first length M1 may be greater than zero (0).

According to still other embodiments, the first portion of the first gate contact plug 235a may contact the second edge portion 212 and the second portion of the first gate contact plug 235a may overlap the active region ACT adjacent to the second edge portion 212. In this case, the second length M2 of the second edge portion 212 may be smaller than a sum of the second width Wcb and a horizontal distance in the second direction Db between one end of the second edge portion 212 on the device isolation pattern 102 and one end of the first gate contact plug 235a overlapping the device isolation pattern 102. The horizontal distance in the second direction Db may be about 5% to about 15% of the second width Web. The second length M2 may be greater than zero (0).

As described above, at least some of the first gate contact plug 235a overlaps the active region ACT. By doing so, it is possible to increase the size of the active region ACT within a given area. Also, the first gate electrode 210a may include channel lengths extending in a plurality of different directions. As a result, the amount of turn-on current of the transistor within the given area can be increased to thus realize an integrated circuit device which can be improved or optimized for high integration and can have superior reliability. Also, four transistors may be formed in the active region and may share the source region 223. Therefore, the area occupied by the four transistors may be decreased to thus increase the amount of turn-on current of the transistors.

A second gate contact plug 235b, a third gate contact plug 235c and a fourth gate contact plug 235d may sequentially penetrate the interlayer dielectric layer 130 and the capping dielectric pattern 220 to contact the second, third and fourth gate electrodes 210b, 210c and 210d, respectively. At least a portion of each of the second, third and fourth gate electrodes 210b, 210c, and 210d may overlap the active region ACT. According to an embodiment, the positions of the first to fourth gate contact plugs 235a, 235b, 235c and 235d may be controlled according to the layout of interconnection lines (not shown) connected thereto. According to an embodiment, the third gate contact plug 235c may be offset from a virtual straight line which passes through a central point of the upper surface of the first gate contact plug 235a and extends in the second direction Db. The second gate contact plug 235b may have a substantially symmetric structure to the first gate contact plug 235a with respect to the first virtual straight line Vb. The fourth gate contact plug 235d may have a substantially symmetric structure to the third gate contact plug 235c with respect to the first virtual straight line Vb. The first to fourth gate contact plugs 235a, 235b, 235c and 235d may be formed of the same material as the gate contact plugs 135 and 136 of FIGS. 1A, 1B and 1C.

A first drain-contact plug 240a may penetrate the interlayer dielectric layer 130 to be connected to the first drain region 222a. A source-contact plug 241 may penetrate the interlayer dielectric layer 130 to be connected to the source region 223. As shown in FIG. 5A, an upper surface of the first drain-contact plug 240a may have a bar shape extending along one direction in plan view. An extending length of the first extending portion 207 of the first gate electrode 210a may be different from that of the second extending portion 208. The upper surface of the first drain-contact plug 240a may extend in parallel to a longer one of the first or second extending portions 207 or 208. For example, as shown in FIG. 5A, in the case where the extending length of the second extending portion 208 is longer than that of the first extending portion 207, the upper surface of the drain-contact plug 240a may extend in parallel to the second extending portion 208. An upper surface of the source-contact plug 241 may have a bar shape extending in parallel to the upper surface of the first drain-contact plug 240a in plan view. According to an embodiment, an extending length of the source-contact plug 241 may be different from an extending length of the upper surface of the first drain-contact plug 240a. For example, as shown in FIG. 5A, the extending length of the source-contact plug 241 may be longer than the extending length of the first drain-contact plug 240a. In this case, a plan area of the source region 223 may be wider than that of the first drain region 222a. As the source region 223 is shared by the four transistors, a plurality of the source-contact plugs 241 may be disposed on the source region 223.

A second drain-contact plug 240b, a third drain-contact plug 240c and a fourth drain-contact plug 240d may penetrate the interlayer dielectric layer 130 to be connected to the second, third and fourth drain regions 222b, 222c and 222d, respectively. Upper surfaces of the second, third and fourth drain-contact plugs 240b, 240c and 240d may also extend in parallel to the upper surface of the source-contact plug 241.

Integrated circuit devices according to embodiments may include a plurality of sense amplifier blocks. Each of the plurality of sense amplifier blocks may include an NMOS sense amplifier driver and a PMOS sense amplifier driver. According to some embodiments, the transistors shown in FIGS. 5A and 5B may be transistors included in the NMOS sense amplifier driver or the PMOS sense amplifier driver. The sense amplifier drivers will be described with reference to the accompanying drawings.

Figure 6A:
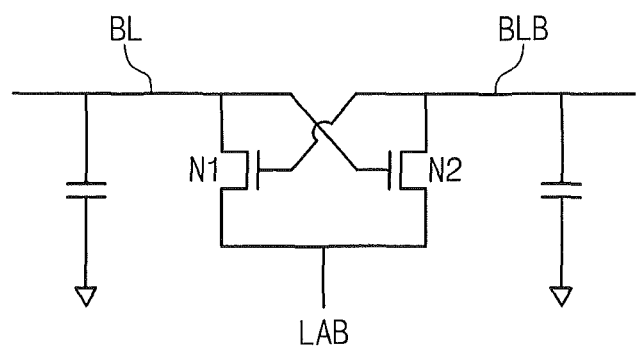
FIG. 6A is a circuit diagram of an NMOS sense amplifier driver included in a sense amplifier block of an integrated circuit device according to various embodiments of the inventive concept.

FIG. 6A is a circuit diagram of an NMOS sense amplifier driver included in a sense amplifier block of the device according to embodiments of the inventive concept.

Referring to FIG. 6A, the NMOS sense amplifier driver in the sense amplifier block may include a first NMOS transistor N1 and a second NMOS transistor N2. A gate of the first NMOS transistor N1 may be electrically connected to a bit bar line BLB and a drain of the first NMOS transistor N1 may be electrically connected to a bit line BL. A source of the first NMOS transistor N1 may be electrically connected to a ground voltage supply line LAB. A gate of the second NMOS transistor N2 may be electrically connected to the bit line BL and a drain of the second NMOS transistor N1 may be electrically connected to the bit bar line BLB. A source of the second NMOS transistor N2 may be electrically connected to the ground voltage supply line LAB. Thus, the first and second NMOS transistors N1 and N2 may be connected in a latch structure.

Referring to FIGS. 5A and 6A, according to an embodiment, the first, second, third and fourth transistors including the first to fourth gate electrodes 210a, 210b, 210c and 210d respectively may be NMOS transistors. At this time, the first transistor including the first gate electrode 210a may correspond to the first NMOS transistor N1 of the NMOS sense amplifier driver, and the third transistor including the third gate electrode 210c may correspond to the second NMOS transistor N2 of the NMOS sense amplifier driver. In this case, the first drain-contact plug 240a and the third gate contact plug 235c may be electrically connected to a first bit line and the third drain-contact plug 240c and the first gate contact plug 235a may be electrically connected to a first bit bar line. The source-contact plug 241 may be electrically connected to the ground voltage supply line LAB. The first and third transistors including the first and third gate electrodes 210a and 210c may be included in a first NMOS sense amplifier driver.

Similarly to this, the second and fourth transistors respectively including the second and fourth gate electrodes 210b and 210d may be included in a second NMOS sense amplifier driver. The second transistor including the second gate electrode 210b may correspond to the first NMOS transistor N1 in the second NMOS sense amplifier driver, and the fourth transistor including the fourth gate electrode 210d may correspond to the second NMOS transistor N2 in the second NMOS sense amplifier driver. In this case, the second drain-contact plug 240b and the fourth gate contact plug 235d may be electrically connected to a second bit line and the fourth drain-contact plug 240d and the second gate contact plug 235b may be electrically connected to a second bit bar line.

The first bit line and the first bit bar line connected to the first NMOS sense amplifier driver are different from the second bit line and the second bit bar line connected to the second NMOS sense amplifier driver, respectively. The first to fourth transistors including the first to fourth gate electrodes 210a, 210b, 210c and 210d may constitute a pair of NMOS sense amplifier drivers (that is, the first and second NMOS sense amplifier drivers). The pair of the NMOS sense amplifier drivers may be included in a pair of sense amplifier blocks, respectively.

Figure 6B:
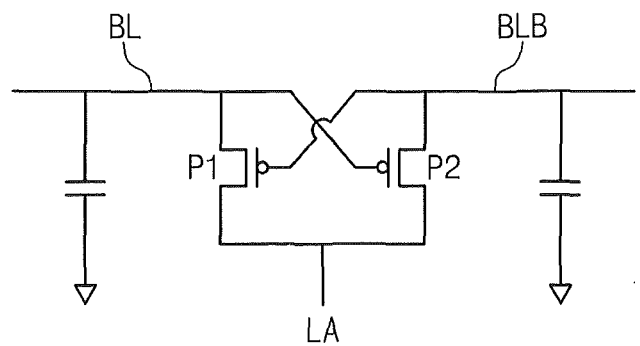
FIG. 6B is a circuit diagram of a PMOS sense amplifier driver included in a sense amplifier block of an integrated circuit device according to various embodiments of the inventive concept.

FIG. 6B is a circuit diagram of a PMOS sense amplifier driver included in a sense amplifier block of a device according to embodiments of the inventive concept.

Referring to FIG. 6B, the PMOS sense amplifier driver in the sense amplifier block may include a first PMOS transistor P1 and a second PMOS transistor P2. A gate of the first PMOS transistor P1 may be electrically connected to a bit bar line BLB and a drain of the first PMOS transistor P1 may be electrically connected to a bit line BL. A source of the first PMOS transistor P1 may be electrically connected to a power supply line LA. A gate of the second PMOS transistor P2 may be electrically connected to the bit line BL and a drain of the second PMOS transistor P2 may be electrically connected to the bit bar line BLB. A source of the second PMOS transistor P2 may be electrically connected to the power supply line LA. Thus, the first and second PMOS transistors P1 and P2 may be connected in a latch structure.

Referring to FIGS. 5A and 6B, according to an embodiment, the first to fourth transistors respectively including the first to fourth gate electrodes 210a, 210b, 210c and 210d may be PMOS transistors. In this case, the first transistor including the first gate electrode 210a may correspond to the first PMOS transistor P1 of the PMOS sense amplifier driver, and the third transistor including the third gate electrode 210c may correspond to the second PMOS transistor P2 of the PMOS sense amplifier driver. In this case, the first drain-contact plug 240a and the third gate contact plug 235c may be electrically connected to a first bit line and the third drain-contact plug 240c and the first gate contact plug 235a may be electrically connected to a first bit bar line. The source-contact plug 241 may be electrically connected to the power supply line LA. The first and third transistors including the first and third gate electrodes 210a and 210c may be included in a first PMOS sense amplifier driver.

Similarly to this, the second and fourth transistors including the second and fourth gate electrodes 210b and 210d may be included in a second PMOS sense amplifier driver. The second transistor including the second gate electrode 210b may correspond to the first PMOS transistor P1 of the second PMOS sense amplifier driver, and the fourth transistor including the fourth gate electrode 210d may correspond to the second PMOS transistor P2 of the second PMOS sense amplifier driver. In this case, the second drain-contact plug 240b and the fourth gate contact plug 235d may be electrically connected to a second bit line and the fourth drain-contact plug 240d and the second gate contact plug 235b may be electrically connected to a second bit bar line.

The first to fourth transistors including the first to fourth gate electrodes 210a, 210b, 210c and 210d may constitute a pair of PMOS sense amplifier drivers (that is, the first and second PMOS sense amplifier drivers). The pair of the PMOS sense amplifier drivers may be included in a pair of sense amplifier blocks, respectively.

According to an embodiment, each sense amplifier block included in the device may include the NMOS sense amplifier driver and the PMOS sense amplifier driver. In this case, a transistor group including the transistors including the gate electrodes 210a, 210b, 210c and 210d of FIGS. 5A and 5B may be provided in plurality in the device. At this time, any one of the plurality of transistor groups may be implemented in the pair of the NMOS sense amplifier drivers respectively being included in the pair of sense amplifier block and another one may be implemented in the pair of the PMOS sense amplifier driver respectively being included in the pair of sense amplifier block.

As described above, the transistors disclosed in FIGS. 5A and 5B may be implemented in a sense amplifier driver in the sense amplifier block. However, the present invention is not limited thereto. The transistors disclosed in FIGS. 5A and 5B may be transistors performing other use and/or other function.

Additional discussion of various embodiments of FIGS. 5A-6B will now be provided. More specifically, FIGS. 5A-6B illustrate four transistor circuit layouts for an integrated circuit substrate according to various embodiments. These layouts include an isolation region 102 in an integrated circuit substrate 100 defines an active region ACT that extends along first and second different directions Da, Db, respectively. A+ shaped common source region 223 of the four transistors T1, T2, T3, T4 extends from a center C of the active region along both the first and second directions Da, Db, as defined by virtual lines Va, Vb, respectively, to define four quadrants Q1, Q2, Q3 and Q4 of the active region ACT that are outside the common source region 223. Four drain regions 240a, 240b, 240c and 240d are provided, a respective one of which is in a respective one of the four quadrants Q1, Q2, Q3 and Q4, and spaced apart from the common source region 223. Four gate electrodes 210a, 210b, 210c and 210d are also provided, a respective one of which is in a respective one of the four quadrants Q1, Q2, Q3 and Q4 between the common source region 223 and a respective one of the four drain regions 240a, 240b, 240c and 240d. A respective gate electrode includes a first vertex V1 and first and second extending portions 207 and 208, respectively. The first extending portions 207 extend from the vertex V1 along the first direction Da, and the second extending portions 208 extend from the vertex V1 along the second direction Db.

In other embodiments, the drain regions and the gate electrodes of a first pair of the four transistors, such as transistors T1 and T2, are symmetric with respect to the drain regions and the gate electrodes of a second pair of the four transistors, such as T3 and T4, about a portion of the common source region 223 that extends from the center of the active region C along the first direction Da, i.e., about virtual line Va. In other embodiments, the drain regions and the gate electrodes of a first pair of the four transistors, such as T1 and T3, are symmetric with respect to the drain regions and the gate electrodes of a second pair of the four transistors, such as T2 and T4, about a portion of the common source region 223 that extends from the center C of the active region along the second direction Db, i.e., symmetric about the virtual line Vb.

Various embodiments of FIGS. 5A-6B also include four drain contact plugs 240a, 240b, 240c and 240d, a respective one of which electrically contacts a respective one of the drain regions 240a, 240b, 240c, 240d in a respective one of the four quadrants Q1-Q4. The drain regions, the gate electrodes and the drain contact plugs may be symmetric about the first virtual line Va and/or about the second virtual line Vb.

Various embodiments of FIGS. 5A-6B also include a pair of source contact plugs 241, a first one of which is between the second extending portions 208 of the gate electrodes of a first pair of the four transistors, such as T1, T2, and a second one of which is between the second extending portions 208 of the gate electrodes of a second pair of the four transistors, such as T3, T4. The drain regions, the gate electrodes and the source electrode of a first pair of transistors may be symmetric with the corresponding regions of a second pair of the four transistors, and the source electrode of the second pair of transistors about the virtual line Va and/or Vb.

Moreover, in some embodiments, ends 211 and/or 212 of the first and second extending portions of the four gate electrodes may extend beyond the active region ACT onto the isolation region 102. Moreover, four gate contact plugs 235a, 235b, 235c and 235d may be provided, a respective one of which is electrically connected to a respective one of the four gate electrodes 210a, 210b, 210c, 210d. In some embodiments, a pair of gate contact plugs 235a, 235b are connected to a respective one of the pair of electrodes adjacent the first vertices V1 thereof, and a second pair 235c, 235d of which are connected to a respective one of the pair of the gate electrodes remote from the first vertices V1 thereof. The gate contact plugs 235c and 235d may be contained within the active regions, as may the gate contact plugs 235a, 235b.

Figure 11:
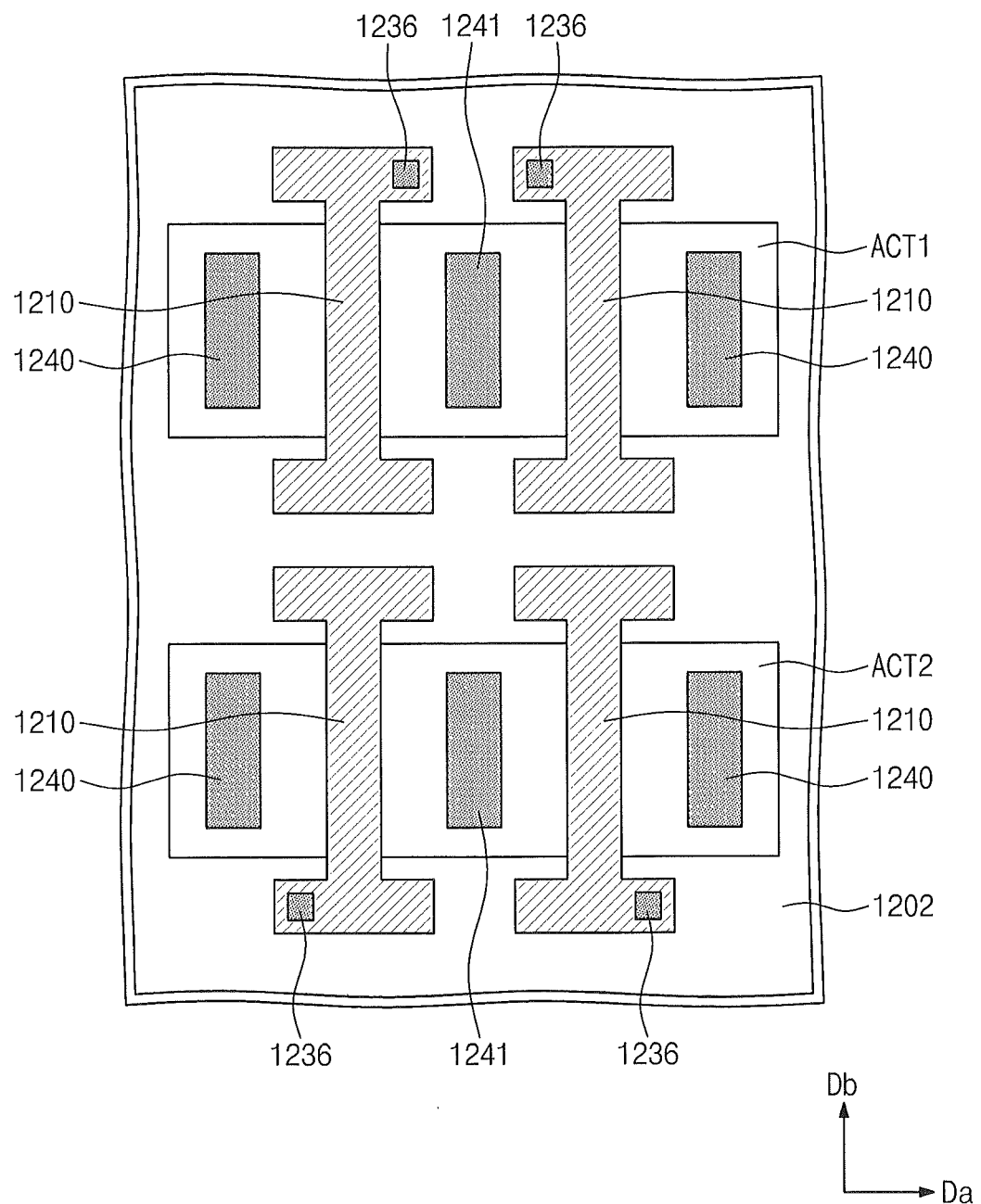
FIG. 11 is a plan view of a conventional four transistor layout for an integrated circuit substrate.

Various embodiments of four transistor layouts that are described herein may be contrasted with conventional four transistors layouts as illustrated, for example, in FIG. 11. As shown in FIG. 11, an isolation region 1202 defines two spaced apart active regions ACT1 and ACT2. For a pair of transistors, a source region and a source contact 1241, and a drain region and a drain contact 1240, are provided within a given active region ACT1, ACT2, with a given gate electrode 1210 extending between the source contact 1241 and a respective drain contact 1240. The gate electrodes 1210 include gate contact plugs 1236, which are provided on the isolation region 1202, and do not overlap the active regions ACT1 or ACT2.

In sharp contrast, various embodiments described herein may include a single active region ACT for the four transistors, and a source region which may extend in both directions Da and Db, to provide a + shaped common source region for the four transistors.

Next, various modified examples of the present embodiments will be described with reference to the accompanying drawings. According to the modified examples, the gate electrode may have various plan shapes. A description will be given of main features of the modified examples. In the following modified examples, a gate dielectric layer is disposed between the gate electrode and the active region, and a capping dielectric pattern such as the capping dielectric pattern 220 of FIG. 5B may be disposed on the gate electrode. An upper surface of the capping dielectric pattern on the gate electrode in each modified example may have the same shape as the upper surface of the gate electrode.

Figure 7A:
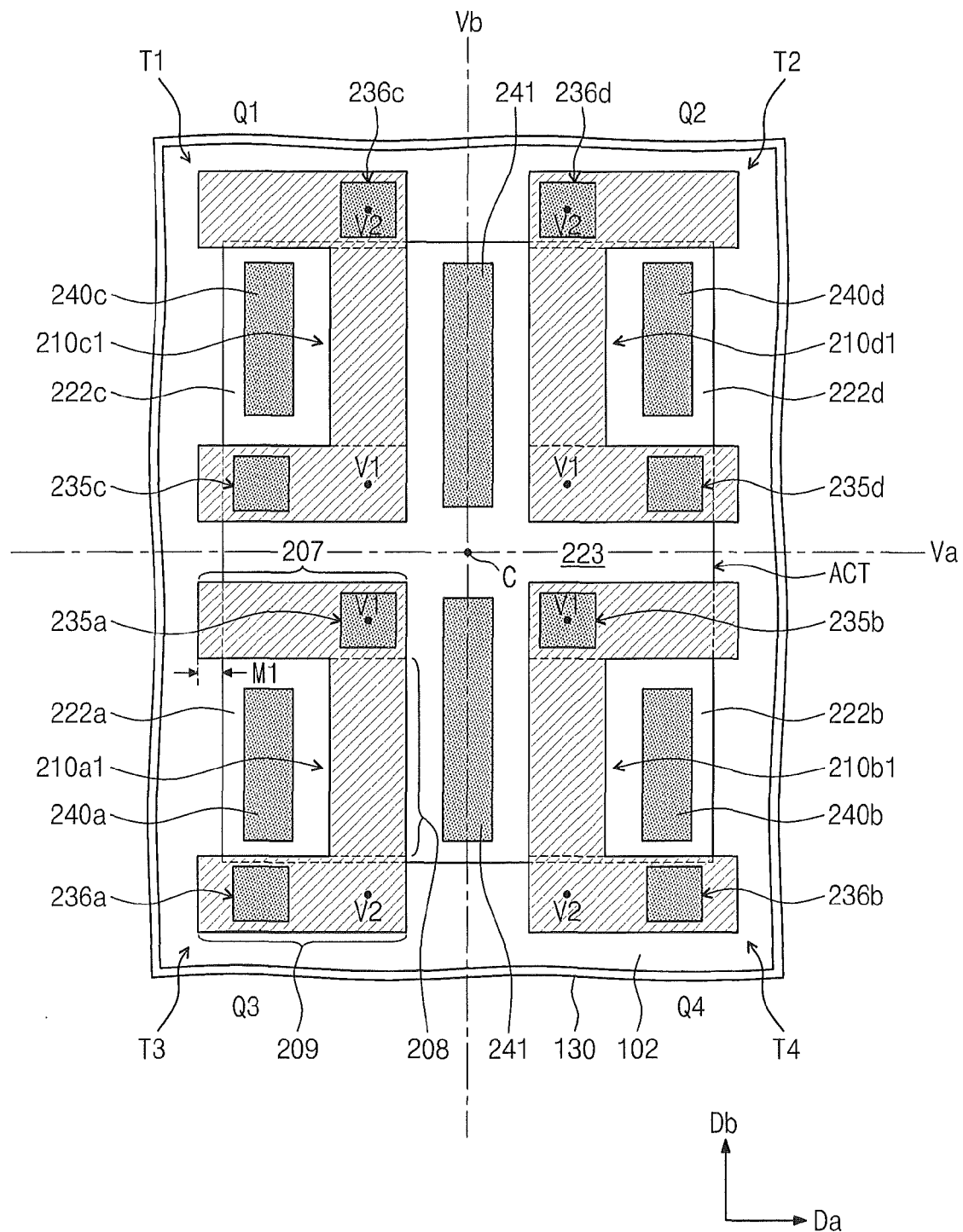
FIG. 7A is a plan view illustrating a modified example of an integrated circuit device according to other embodiments of the inventive concept.

FIG. 7A is a plan view illustrating a modified example of an integrated circuit device according to other embodiments of the inventive concept.

Referring to FIG. 7A, a first gate electrode 210a1 may be disposed over an active region ACT. The first gate electrode 210a1 may include a first extending portion 207 extending in a first direction Da, a second extending portion 208 extending in a second direction Db, and a third extending portion 209 extending in the first direction Da. The third extending portion 209 may face the first extending portion 207 and may be spaced apart from the first extending portion 207. The first and third extending portions 207 and 209 may be connected to both ends of the second extending portion 208, respectively. At least a portion of the third extending portion 209 may overlap a device isolation pattern 102. According to the present modified example, the second extending portion 208 may not overlap the device isolation pattern 102.

A plurality of first-gate contact plugs 235a and 236a may be connected to an upper surface of the first gate electrode 210a1. At least one of the plurality of first gate contact plugs 235a and 236a overlaps the active region ACT. In FIG. 7A, the entire upper surface of the first gate contact plug 235a on the first extending portion 207 may overlap the active region ACT. The entire upper surface of the first gate contact plug 236a on the third extending portion 209 may overlap the device isolation pattern 102.

A second gate electrode 210b1, a third gate electrode 210c1 and a fourth gate electrode 210d1 may be disposed over the active region ACT. The first to fourth gate electrodes 210a1, 210b1, 210c1 and 210d1 may be spaced apart from one another, and may be arranged two-dimensionally along the row direction and the column direction. The second gate electrode 210b1 may have a substantially symmetric structure to the first gate electrode 210a1 with respect to the first virtual straight line Vb described with reference to FIGS. 5A and 5B, and the third gate electrode 210c1 may have a substantially symmetric structure to the first gate electrode 210a1 with respect to the second virtual straight line Va. The fourth gate electrode 210d1 may have a substantially symmetric structure to the third gate electrode 210c1 with respect to the first virtual straight line Vb. A plurality of second gate contact plugs 235b and 236b may contact an upper surface of the second gate electrode 210b1, and a plurality of third gate contact plugs 235c and 236c may contact an upper surface of the third gate electrode 210c1. A plurality of fourth gate contact plugs 235d and 236d may contact an upper surface of the fourth gate electrode 210d1. The gate contact phigs 235b, 235c and 235d on the first extending portions of the second, third and fourth gate electrodes 210b1, 210c1 and 210d1 may overlap the active region ACT. The gate contact plugs 236b, 236c and 236d on the third extending portions of the second, third and fourth gate electrodes 210b1, 210c1 and 210d1 may overlap the device isolation pattern 102.

Transistors including the first to fourth gate electrodes 210a1, 210b1, 210c1 and 210d1 disclosed in FIG. 7A may be implemented in the pair of NMOS sense amplifier drivers or the pair of PMOS sense amplifier drivers. However, the present invention is not limited thereto. The transistors of FIG. 7A may be used for other function and/or purpose.

Figure 7B:
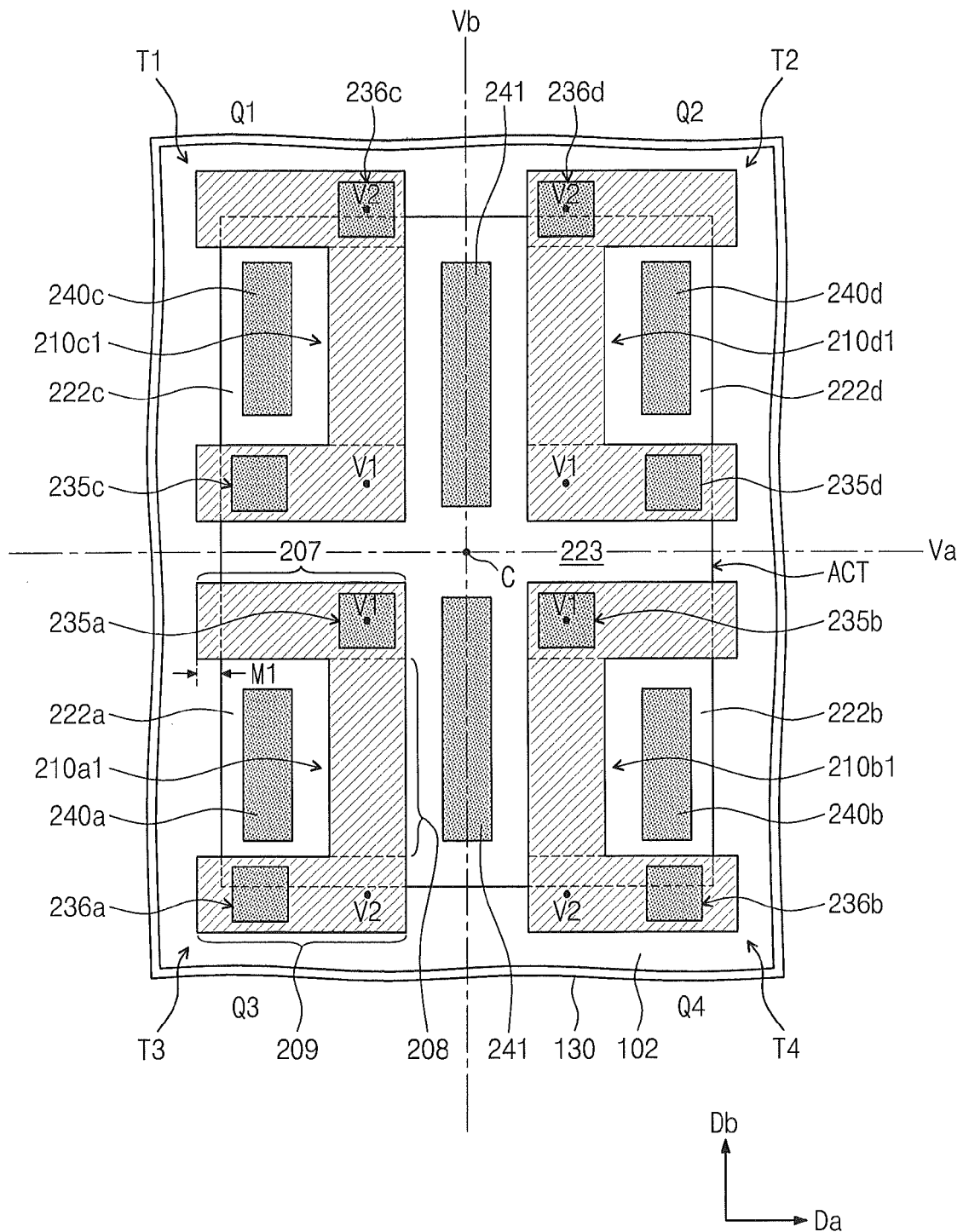
FIG. 7B is a plan view illustrating another modified example of an integrated circuit device according to other embodiments of the inventive concept.

FIG. 7B is a plan view illustrating another modified example of a device according to another embodiment of the inventive concept.

Referring to FIG. 7B, at least a portion of a first gate contact plug 236a on a third extending portion 209 of a first gate electrode 210a1 may overlap an active region ACT. Due to this, the width of the active region ACT in a second direction Db can be increased, so that the amount of turn-on current of the transistor in a given area may be further increased. In this case, a portion of the third extending portion 209 overlapping the device isolation pattern 102 may have an overlapping length in the second direction Db. The overlapping length may be smaller than a sum of a width of the first gate contact plug 236a in the second direction Db, and a horizontal distance in the second direction Db between one end of the first gate contact plug 236a on the device isolation pattern 102 and one end of the third extending portion 209 overlapping the device isolation pattern 102.

Accordingly, FIGS. 7A and 7B illustrate other embodiments wherein a respective gate electrode 210a1-210d1 also includes a third extending portion 209 that extends from an end of a respective second extending portion 208 that is remote from the respective first vertex V1 and extends along the first direction Da. The second and third extending portions 208 and 209 define a respective second vertex V2 therebetween. In some embodiments, as illustrated for example in FIG. 7B, the third extending portions 209 at least partially overlap the isolation region 102. In other embodiments, as illustrated for example in FIG. 7A, third extending portions 209 do not substantially overlap the active region ACT. In other embodiments, the drain regions and the gate electrodes of a first pair of the four transistors, such as T1 and T2, are symmetric with respect to the drain regions and the gate electrodes of a second pair of the four transistors, such as T3 and T4, about a portion of the common source region that extends from the center C along the first direction Da. In other words, they are symmetrical about the vertical line Va. In other embodiments, the drain regions and the gate electrodes of a first pair of four transistors, such as T1 and T3 are symmetric with respect to the drain regions and the gate electrodes of a second pair of the four transistors, such as T2 and T4 about a portion of the common source region that extends from the center C of the active region ACT along the second direction Db. In other words, the transistors can be symmetric about the virtual straight line Vb.

Still other embodiments may add four drain contact plugs 240a-240d, a respective one of which electrically contacts a respective one of the drain regions in a respective one of the four quadrants Q1-Q4. The drain contact plugs may also be symmetric about the first virtual straight line Vb and/or the second virtual straight line Va. A pair of source contact plugs 241 also may be added, a first one of which is between the second extending portions 208 of the gate electrodes of a first pair of four transistors, such as T1 and T2, and a second one of which is between the second extending portions 208 of the gate electrodes of a second pair of the four transistors, such as T3 and T4. The source contact plugs 241 may also be symmetric about the first virtual straight line Vb and/or about the second virtual straight line Va. Moreover, as illustrated in FIGS. 7A and 7B, ends of the first and third extending portions 207 and 209 may extend beyond the active region ACT onto the isolation region 102.

Moreover, four gate contact plugs 235a-235d may be provided, a respective one of which is electrically connected to a respective one of the four gate electrodes, a pair of which, such as 235a and 235b, are connected to a respective one of the pair of gate electrodes adjacent the first vertices V1 thereof, and a second pair of which, such as 235c and 235d, are connected to a respective one of the pair of gate electrodes remote from the first vertices V1 thereof. Four second gate contact plugs 236a-236d may also be provided, a respective one of which is electrically connected to a respective one of the four gate electrodes. A pair of the second gate contact plugs, such as 236c and 236d, are connected to a respective one of the pair of gate electrodes adjacent the second vertices V2 thereof, and another pair of which, such as 236a and 236b, are connected to a respective one of a pair of gate electrodes on the third extensions 209 remote from the second vertices V2.

Figure 7C:
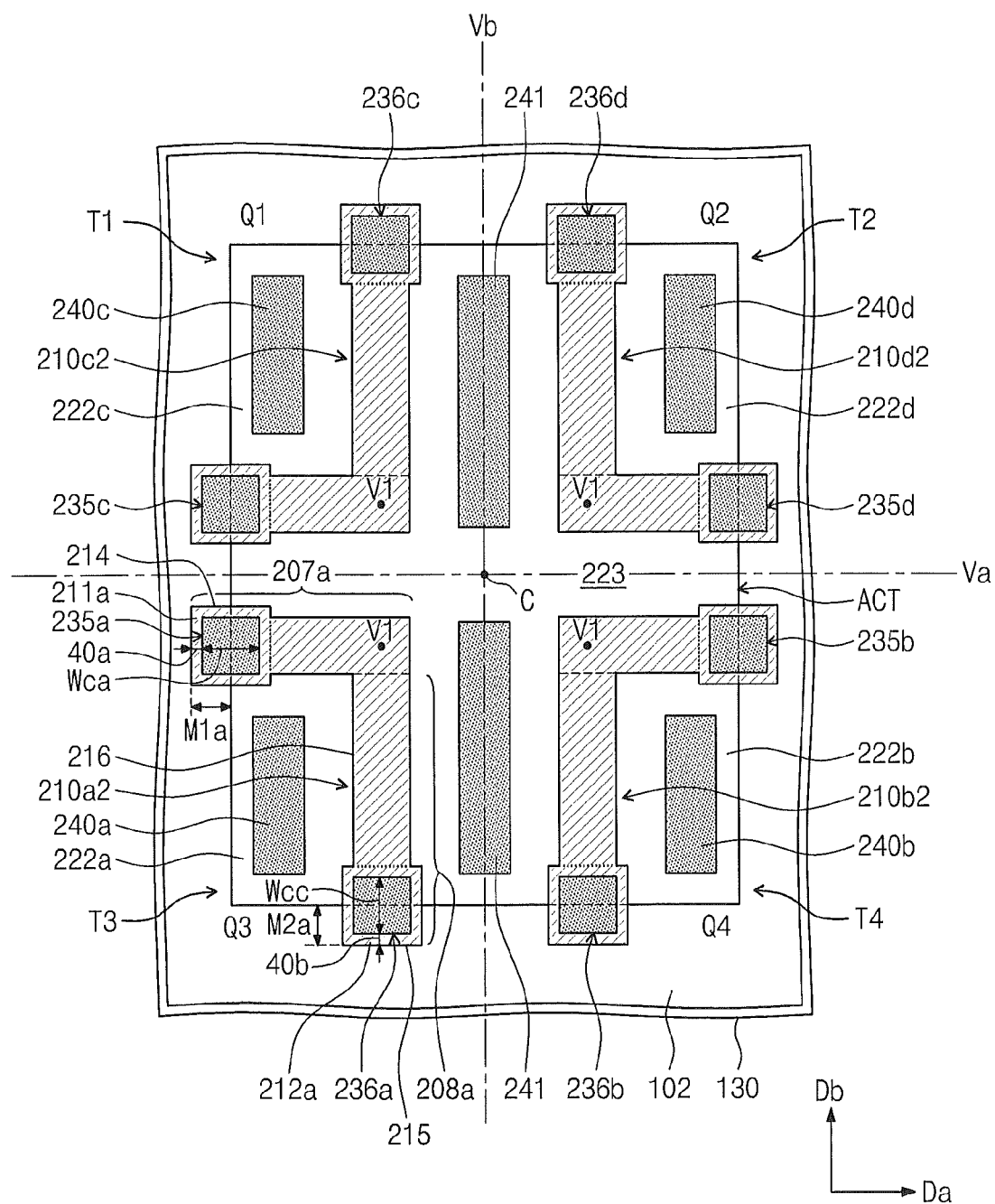
FIG. 7C is a plan view illustrating another modified example of an integrated circuit device according to other embodiments of the inventive concept.

FIG. 7C is a plan view illustrating another modified example of an integrated circuit device according to other embodiments of the inventive concept.

Referring to FIG. 7C, a first gate electrode 210a2 may include a first extending portion 207a extending in a first direction Da and a second extending portion 208a extending in a second direction Db. At least one of the first or second extending portions 207a and 208a may include a landing portion 214 or 215 and a non-landing portion. According to the present modified example, the first extending portion 207a may include a first landing portion 214 and a non-landing portion, and the second extending portion 208a may include a second landing portion 215 and a non-landing portion. The non-landing portions of the first and second extending portions 207a and 208a may be connected to each other to implement a single bent non-landing portion 216.

The first landing portion 214 may overlap a portion of a device isolation pattern 102 adjacent to one side of the active region ACT parallel to the second direction Db and a portion of the active region ACT. The width of the first landing portion 214 in the second direction Db may be greater than the width of the non-landing portion of the first extending portion 207a in the second direction Db. The portion of the first landing portion 214 overlapping the device isolation pattern 102 may correspond to a first edge portion 211a of the first gate electrode 210a2 overlapping the device isolation pattern 102. The second landing portion 215 may overlap another portion of the device isolation pattern 102 adjacent to one side of the active region ACT parallel to the first direction Da and another portion of the active region ACT. The width of the second landing portion 215 in the first direction Da may be greater than the width of the non-landing portion of the second extending portion 208a in the first direction Da. The portion of the second landing portion 215 overlapping the device isolation pattern 102 may correspond to a second edge portion 212a of the first gate electrode 210a2 overlapping the device isolation pattern 102. A pair of first gate contact plugs 235a and 236a may contact the first landing portion 214 and the second landing portion 215, respectively. As in the foregoing embodiment 1, the widths of the first landing portion 214 in the first and second directions Da and Db may be greater than the widths of the first gate contact plug 235a on the first landing portion 214 in the first and second directions Da and Db, respectively. Likewise, the widths of the second landing portion 215 in the first and second directions Da and Db may be greater than the widths of the first gate contact plug 236a on the second landing portion 215 in the first and second directions Da and Db, respectively.

The first edge portion 211a may have a first length M1a in the first direction Da. The first length M1a may be smaller than a sum of a width Wca of the first gate contact plug 235a and a first horizontal distance 40a. The first horizontal distance 40a may correspond to a distance in the first direction Da between one end of the first landing portion 214 and one end of the first gate contact plug 235a overlapping the device isolation pattern 102. According to an embodiment, the first length M1a may be smaller than the width Wca of the first gate contact plug 235a. Similarly to this, the second edge portion 212a may have a second length M2a in the second direction Db. The second length M2a may be smaller than a sum of a width Wee of the first gate contact plug 236a on the second landing portion 215 in the second direction Db and a second horizontal distance 40b. The second horizontal distance 40b may correspond to a distance in the second direction Db between one end of the second landing portion 215 and one end of the first gate contact plug 236a overlapping the device isolation pattern 102. According to an embodiment, the second length M2a may be smaller than the width Wee of the first gate contact plug 236a. The width Wee may be equal to a width of the first gate contact plug 235a on the first landing portion 214 in the second direction Db.

A second gate electrode 210b2, a third gate electrode 210c2 and a fourth gate electrode 210d2 may be disposed over the active region ACT. The second gate electrode 210b2 may have a substantially symmetric structure to the first gate electrode 210a2 with respect to the first virtual straight line Vb described with reference to FIG. 5A. The third gate electrode 210c2 may have a substantially symmetric structure to the first gate electrode 210a2 with respect to the second virtual straight line Va described with reference to FIG. 5A. The fourth gate electrode 210d2 may have a substantially symmetric structure to the third gate electrode 210c2 with respect to the first virtual straight line Vb. A pair of second gate contact plugs 235b and 236b may contact the first and second landing portions of the second gate electrode 210b2, respectively, and a pair of third gate contact plugs 235c and 236c may contact the first and second landing portions of the third gate electrode 210c2, respectively. A pair of fourth gate contact plugs 235d and 236d may contact the first and second landing portions of the fourth gate electrode 210d2.

The transistors including the first to fourth gate electrodes 210a2, 210b2, 210c2 and 210d2 disclosed in FIG. 7C may be implemented in one pair of NMOS sense amplifier drivers or one pair of PMOS sense amplifier drivers, as described with reference to FIGS. 5A, 6A and 6B. However, the present invention is not limited thereto. The transistors of FIG. 7C may be used for other function and/or purpose.

Figure 7D:
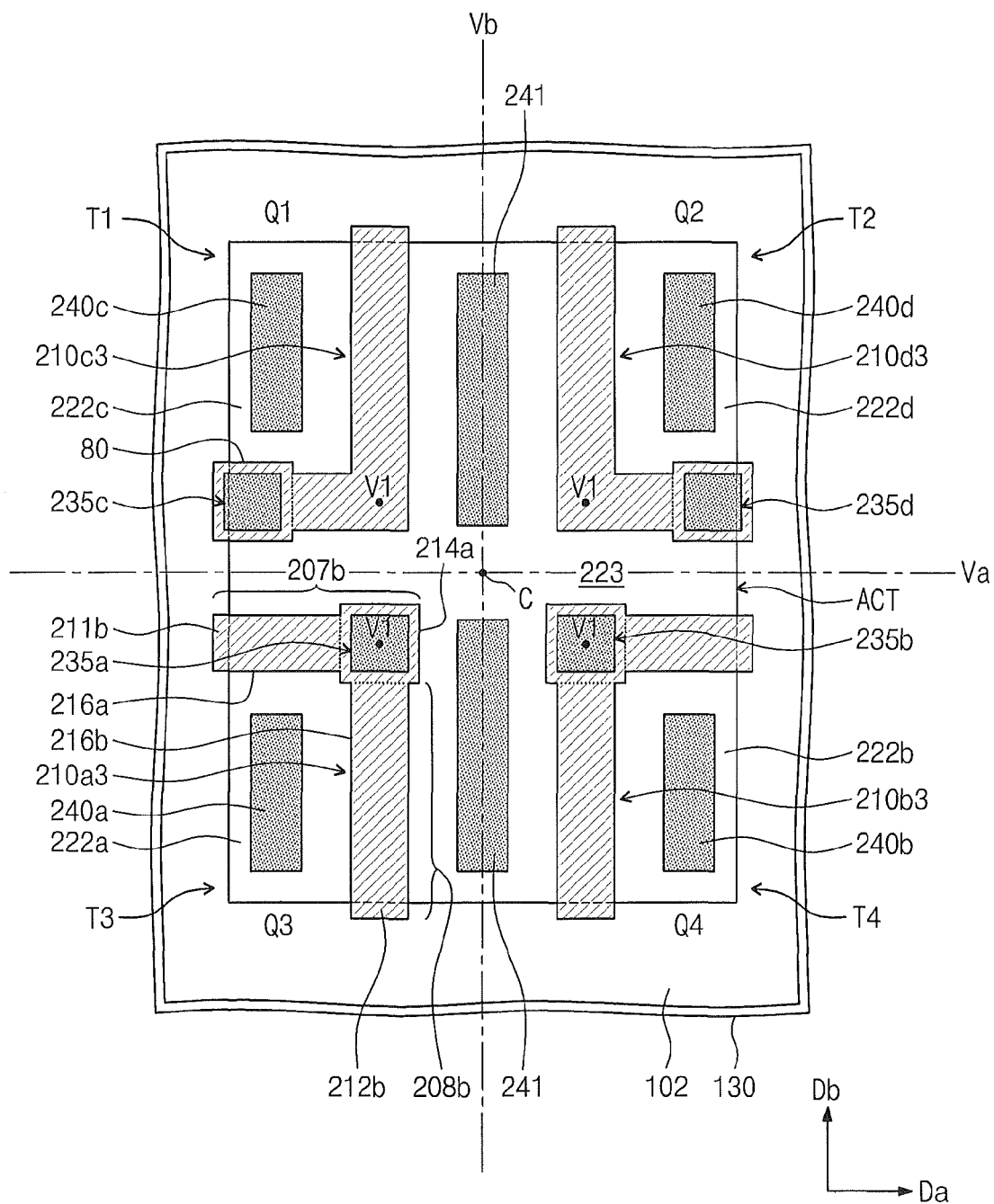
FIG. 7D is a plan view illustrating another modified example of an integrated circuit device according to other embodiments of the inventive concept.

FIG. 7D is a plan view illustrating another modified example of an integrated circuit device according to other embodiments of the inventive concept.

Referring to FIG. 7D, a first gate electrode 210a3 may include a first extending portion 207b extending in a first direction Da and a second extending portion 208b extending in a second direction Db. At least one of the first or second extending portions 207b and 208b may include a landing portion and a non-landing portion. At this time, an entire upper surface of the landing portion may overlap an active region ACT. According to the present modified example, the first extending portion 207b may include a landing portion 214a and a first non-landing portion 216a, and the second extending portion 208b may include a second non-landing portion 216b. All of the second extending portion 208b may correspond to the second non-landing portion 216b. The first non-landing portion 216a may be connected to one side of the landing portion 214a, and may include a first edge portion 211b overlapping a portion of the device isolation pattern 102. The second non-landing portion 216b may be connected to another side of the landing portion 214a, and may include a second edge portion 212b overlapping another portion of the device isolation pattern 102. Since the first and second edge portions 211b and 212b are some portions of the first and second non-landing portions 216a, 216b, a length of the first edge portion 211b in the first direction Da may be smaller than a width of the first gate contact plug 235a in the first direction. And a length of the second edge portion 212b in the second direction Db may be smaller than a width of the first gate contact plug 235a in the second direction Db.

A second gate electrode 210b3, a third gate electrode 210c3 and a fourth gate electrode 210d3 may be disposed over the active region ACT. The second gate electrode 210b3 may have a substantially symmetric structure to the first gate electrode 210a3 with respect to the first virtual straight line Vb described with reference to FIG. 5A. Some of a landing portion 80 of the third gate electrode 210c3 may overlap the device isolation pattern 102. The fourth gate electrode 210d3 may have a substantially symmetric structure to the third gate electrode 210c3 with respect to the first virtual straight line Vb.

According to the present modified example, the landing portions of the first to fourth gate electrodes 210a3, 210b3, 210c3 and 210d3 may be disposed at arbitrary positions in the first to fourth gate electrodes 210a3, 210b3, 210c3 and 210d3 according to layout and/or shape of interconnection lines (not shown) connected to the gate contact plugs 235a, 235b, 235c and 235d. In some embodiments, at least some of the landing portions overlap the active region ACT.

The transistors including the first to fourth gate electrodes 210a3, 210b3, 210c3 and 210d3 disclosed in FIG. 7D may be implemented in one pair of NMOS sense amplifier drivers or one pair of PMOS sense amplifier drivers, as described with reference to FIGS. 5A, 6A and 6B. However, the present invention is not limited thereto. The transistors of FIG. 7D may be used for other function and/or purpose.

Figure 7E:
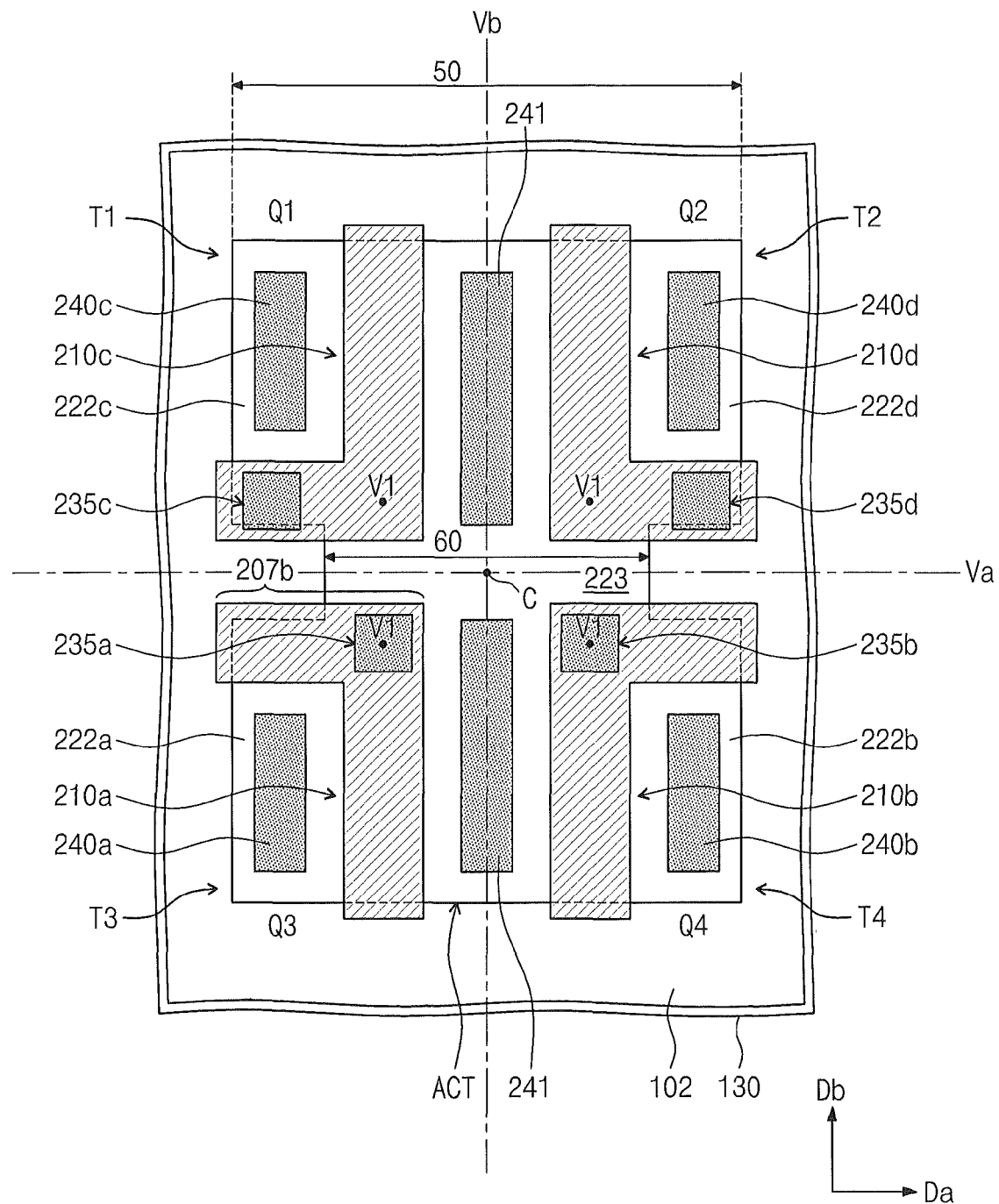
FIG. 7E is a plan view illustrating another modified example of an integrated circuit device according to other embodiments of the inventive concept.

FIG. 7E is a plan view illustrating another modified example of an integrated circuit device according to other embodiments of the inventive concept.

Referring to FIG. 7E, an active region ACT may include a first portion and a second portion. The first portion of the active region ACT may correspond to a region between first and third gate electrodes 210a and 210c and between second and fourth gate electrodes 210b and 210d. The second portion of the active region ACT may include portions overlapping the first and second gate electrodes 210a and 210b, portions where first and second drain regions are formed, and a portion between the first and second gate electrodes 210a and 210b. According to the present modified example, a width 60 of the first portion of the active region ACT in the first direction Da may be smaller than a width 50 of the second portion of the active region ACT in the first direction Da.

Accordingly, FIG. 7E illustrates various embodiments wherein the active region ACT is recessed between the first extending portions 207 of the gate electrodes of a first pair of the four transistors, such as T1 and T3, and between the first extending portions 207 of the gate electrodes of a second pair of the four transistors, such as T2 and T4, so that the isolation region 102 protrudes between the first extending portions 207 of the gate electrodes of the first pair of the four transistors, such as T1 and T3, and between the first extending portions of the electrodes of the second pair of the four transistors, such as T2 and T4. Accordingly, the width of the active region is narrower between the first portions 207 of the gate electrodes, as indicated by 60, compared to other portions of the active region, as indicated by 50.

The transistors disclosed in FIG. 7E may be implemented in one pair of NMOS sense amplifier drivers or one pair of PMOS sense amplifier drivers, as described with reference to FIGS. 5A, 6A and 6B. However, the present invention is not limited thereto. The transistors of FIG. 7E may be used for other function and/or purpose.

Embodiment 3

Figure 8A:
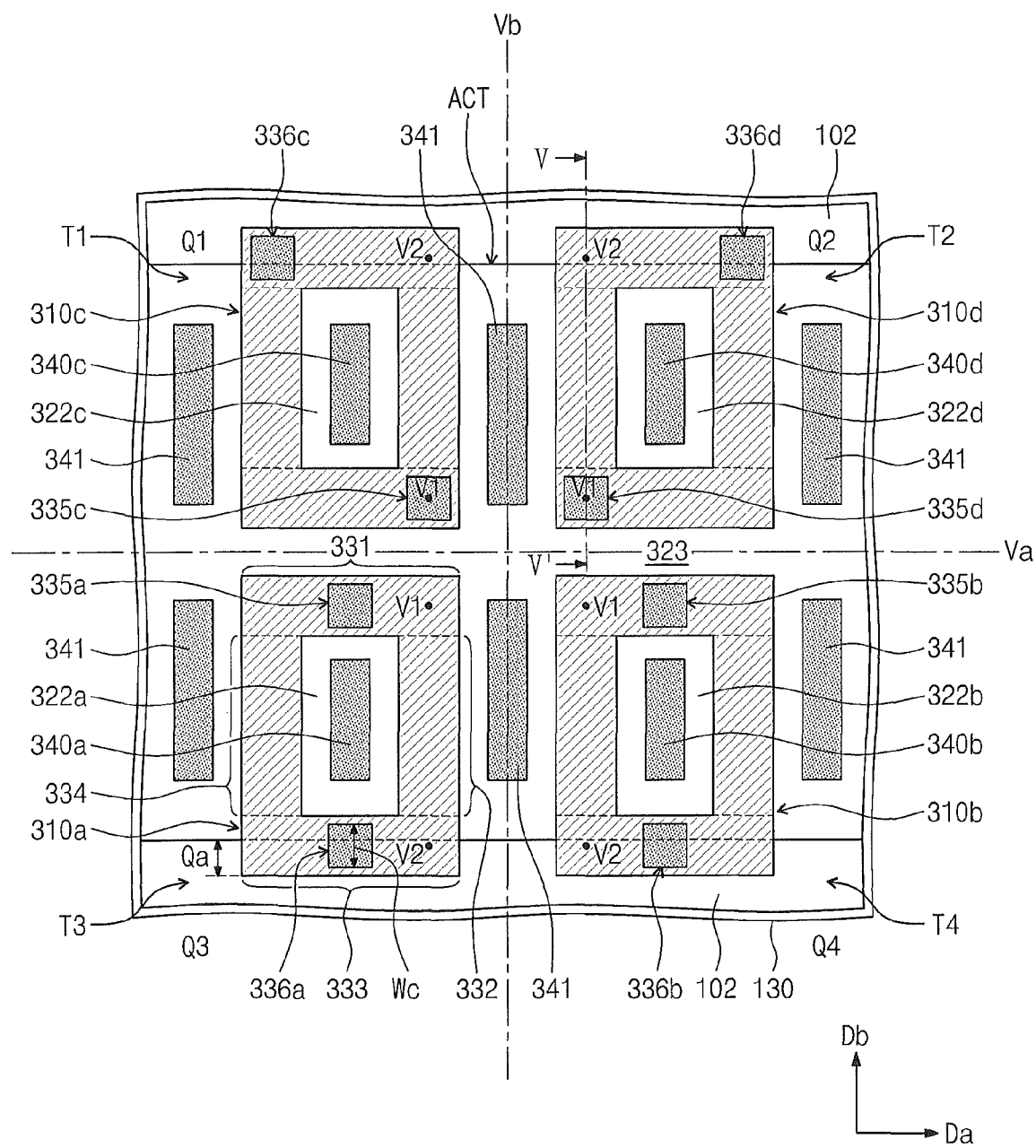
FIG. 8A is a plan view of an integrated circuit device according to still other embodiments of the inventive concept.
Figure 8B:
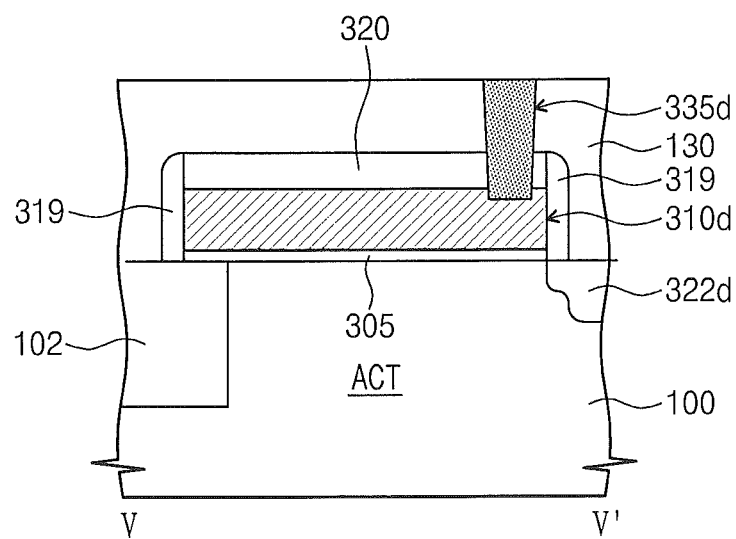
FIG. 8B is a cross-sectional view taken along line V-V' of FIG. 8A.

FIG. 8A is a plan view of an integrated circuit device according to still other embodiments of the inventive concept, and FIG. 8B is a cross-sectional view taken along line V-V' of FIG. 8A.

Referring to FIGS. 8A and 8B, a device isolation pattern 102 defining an active region ACT is disposed in a substrate 100. The active region ACT may extend in a first direction Da. First, second, third and fourth gate electrodes 310a, 310b, 310c and 310d may be disposed over the active region ACT. The first, second, third and fourth gate electrodes 310a, 310b, 310c and 310d may be arranged two-dimensionally along rows and columns. The rows may be parallel to the first direction Da, and the columns may be parallel to the second direction Db. A gate dielectric layer 305 may be disposed between the first, second, third and fourth gate electrodes 310a, 310b, 310c and 310d and the active region ACT. A capping dielectric pattern 320 may be disposed on each of the first to fourth gate electrodes 310a, 310b, 310c and 310d. A gate spacer 319 may be disposed on sidewalls of the first, second, third and fourth gate electrodes 310a, 310b, 310c and 310d. The gate dielectric layer 305, the capping dielectric pattern 320 and the gate spacer 319 may be formed of the same material as the gate dielectric layer 105, the capping dielectric pattern 120 and the gate spacer 119, respectively.

Referring to FIG. 8A, the first gate electrode 310a may include a first extending portion 331, a second extending portion 332, a third extending portion 333 and a fourth extending portion 334. The first extending portion 331 may extend in the first direction Da, and the second extending portion 332 may extend in a second direction Db which is different from the first direction Da. According to an embodiment, the second direction Db may be perpendicular to the first direction Da. The third extending portion 333 may be spaced apart from the first extending portion 331 and may extend in parallel to the first extending portion 331. The first and third extending portions 331 and 333 may be connected to both ends of the second extending portion 332 and may have a shape facing each other. The fourth extending portion 334 may be spaced apart from the second extending portion 332 and may extend in parallel to the second extending portion 332. The second and fourth extending portions 332 and 334 may have a shape facing each other. The first and third extending portions 331 and 333 may be connected to both ends of the fourth extending portion 334, respectively. As disclosed in FIG. 8A, the first gate electrode 310a may have a closed loop shape in plan view. The second gate electrode 310b may have a substantially symmetric structure to the first gate electrode 310a in the first direction Da, and the third gate electrode 310c may have a substantially symmetric structure to the first gate electrode 310a in the second direction Db. The fourth gate electrode 310d may have a substantially symmetric structure to the third gate electrode 310c in the first direction Da.

An interlayer dielectric layer 130 may be disposed over an entire surface of the substrate 100. At least one first gate contact plug 335a may sequentially penetrate the interlayer dielectric layer 130 and a capping dielectric pattern 320 to contact the first gate electrode 310a. At least one of the first gate contact plugs 335a and 336a may overlap the active region ACT. According to the present modified example, the gate contact plugs 335a and 336a may be disposed on the first and third extending portions 331, 333, respectively. An entire upper surface of the first gate contact plug 335a on the first extending portion 331 may overlap the active region ACT. Some portion of the first gate contact plug 336a on the third extending portion 333 may overlap the active region ACT and the other portion may overlap the device isolation pattern 102. In this case, the portion of the first gate contact plug 336a overlapping the device isolation pattern 102 on the third extending portion 333 has a length Qa in the second direction Db. The length Qa may be smaller than a sum of a width We of the first gate contact plug 336a in the second direction Db and a horizontal distance in the second direction Db between one end of the first gate contact plug 336a overlapping the device isolation pattern 102 and one end of the third extending portion 333.

Similarly to this, at least one second gate contact plugs 335b and 336b may sequentially penetrate the interlayer dielectric layer 130 and the capping dielectric pattern 320 to contact the second gate electrode 310b, and at least one third gate contact plugs 335c, 336c may sequentially penetrate the interlayer dielectric layer 130 and the capping dielectric pattern 320 to contact the third gate electrode 310c. At least one fourth gate contact plugs 335d and 336d may sequentially penetrate the interlayer dielectric layer 130 and the capping dielectric pattern 320 to contact the second gate electrode 310d.

As disclosed in FIG. 8A, a first drain region 322a may be disposed in an active region ACT enclosed by the first gate electrode 310a having the closed loop shape in plan view. Likewise, second, third and fourth drain regions 322b, 322c and 322d may be disposed in some portions of the active region enclosed by the second, third and fourth gate electrodes 310b, 310c and 310d. A source region 323 may be disposed in the active region ACT between the first to fourth gate electrodes 310a, 310b, 310c and 310d in plan view. First to fourth transistors including the first to fourth gate electrodes 310a, 310b, 310c and 310d respectively may share the source region 323.

A first drain-contact plug 340a, a second drain-contact plug 340b, a third drain-contact plug 340c and a fourth drain-contact plug 340d may penetrate the interlayer dielectric layer 130 to contact the first to fourth drain regions 322a, 322b, 322c and 322d, respectively, and source-contact plugs 341 may penetrate the interlayer dielectric layer 130 to contact the source region 323. Upper surfaces of the first drain-contact plug 340a and source-contact plug 341 may have a bar shape extending in parallel to each other. According to an embodiment, the upper surfaces of the first drain-contact plug 340a and the source-contact plug 341 may extend in parallel to a longer one of the first or second extending portions 331 or 332. According to the present modified example, the second extending portion 332 is longer than the first extending portion 331, the upper surfaces of the first drain-contact plug 340a and source-contact plug 341 may extend in the second direction Db. The plurality of source-contact plugs 341 may be disposed on the source region 323. The plurality of source-contact plugs 341 may be arranged two-dimensionally along the first and second directions Da and Db. According to an embodiment, as shown in the drawing, the source-contact plugs 341 may form one pair of rows. Of the one pair of rows, the first and second drain-contact plugs 340a and 340b may be disposed between the source-contact plugs included in the first row, and the third and fourth drain-contact plugs 340c and 340d may be disposed between the source-contact plugs 341 included in the second row.

Accordingly, FIGS. 8A and 8B illustrate other embodiments wherein a respective gate electrode 310a-310d also includes a fourth extending portion 334 that extends from an end of a respective first extending portion 331 that is remote from the respective first vertex V1 to an end of the respective third extending portion 333 that is remote from the respective second vertex V2, along the second direction Db. A respective gate electrode including the first through fourth extending portions define a closed loop gate electrode pattern, a respective one of which surrounds a respective one of the drain regions 340a-340d. The drain regions and the gate electrodes may be symmetric with respect to the first and/or second virtual lines Vb and/or Va.

First through sixth source contact plugs 341 may also be provided, a first of which is between the second extending portions 332 of the gate electrodes of a first pair of the four transistors, such as T1 and T2, and a second of which is between the second extending portions 332 of the gate electrodes of the second pair of the four transistors, such as T3 and T4, a third and fourth of which is adjacent a respective fourth extending portion 334 of the gate electrodes of the first pair of the four transistors T1 and T2 opposite the respective drain region 340. Finally, a fifth and sixth of the source contact plugs is adjacent a respective fourth extending portion 334 of the gate electrodes of the second pair of the four transistors T3 and T4 opposite the respective drain regions 340. The drain regions, the gate electrodes and the source electrodes may be symmetric about the first and/or second virtual lines Vb and/or Va.

Four first gate contact plugs 335a, 335b, 336a and 336b may also be provided, a respective one of which is electrically connected to a respective midpoint of a respective one of the first and third extending portions 331 and 333 of the gate electrodes of a first pair of the four transistors, such as T3 and T4. Two second gate contact plugs 335c and 335d may also be provided, a respective one of which is electrically connected to a respective first vertex V1 of the gate electrodes of a second pair of the four transistors, such as T1 and T2. Two third gate electrode contact plugs 336c and 336d may also be provided, a respective one of which is electrically connected at a respective intersection of the respective third and fourth gate extensions 331 and 334 of the gate electrodes of the second pair of the four transistors, such as T1 and T2.

Four transistors disclosed in FIG. 8A may be implemented in one pair of NMOS sense amplifier drivers or one pair of PMOS sense amplifier drivers, as described with reference to FIGS. 5A, 6A and 6B. However, the present invention is not limited thereto. The transistors of FIG. 8A may be used for other function and/or other purpose.

Next, various modified examples of the present embodiment will be described. In the modified examples described below, non-described elements may the same as those described with reference to FIGS. 8A and 8B. Therefore, a description will be given of characteristic portions of the present modified examples.

Figure 9A:
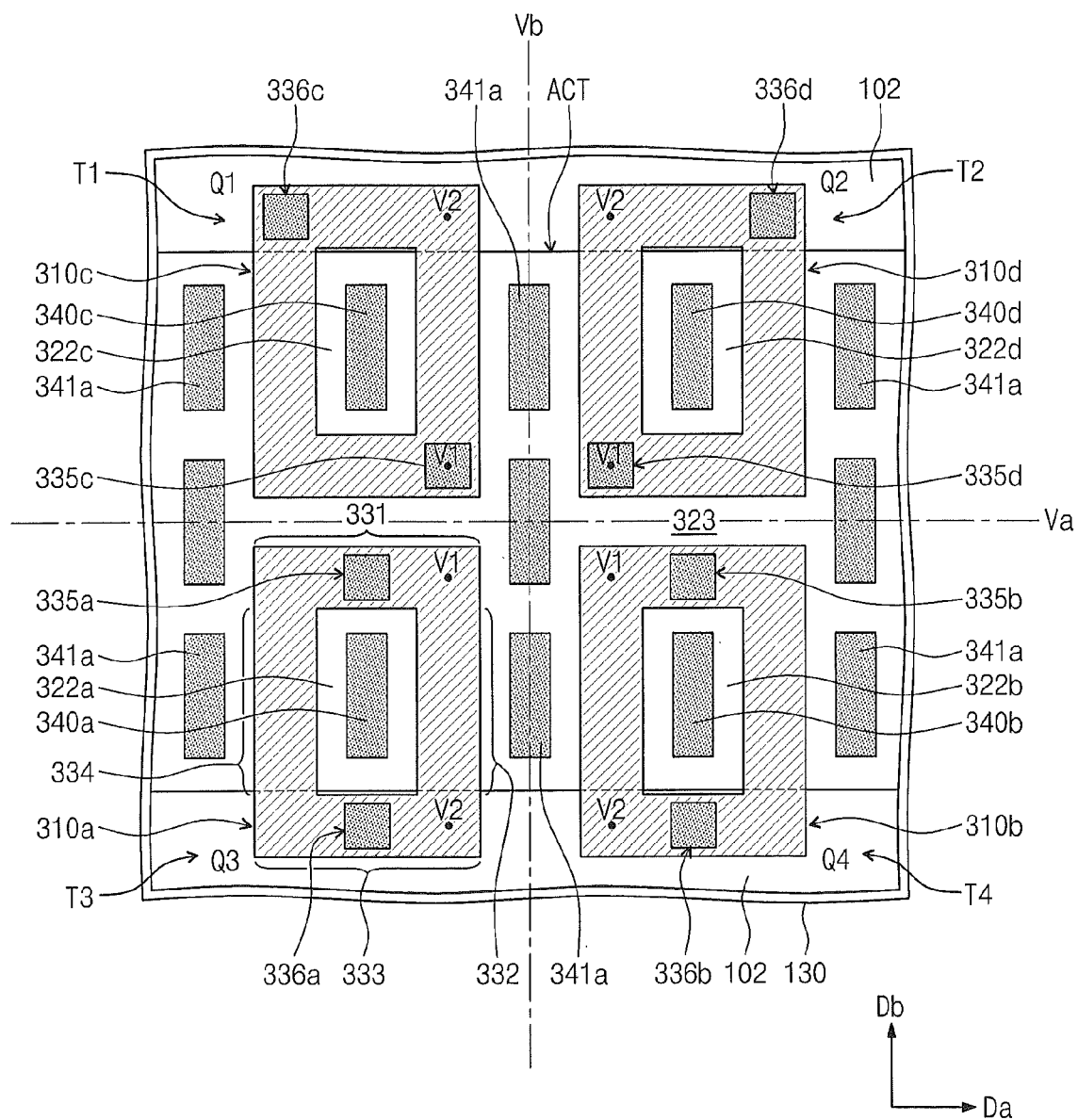
FIG. 9A is a plan view illustrating a modified example of an integrated circuit device according to other embodiments of the inventive concept.

FIG. 9A is a plan view illustrating a modified example of an integrated circuit device according to other embodiments of the inventive concept.

Referring to FIG. 9A, an entire upper surface of a first gate contact plug 336a on a third extending portion 333 of a first gate electrode 310a may overlap a device isolation pattern 102. In this case, in some embodiments, at least some of another first gate contact plug 335a contacting the first gate electrode 310a overlaps the active region ACT. Similarly to this, entire upper surfaces of gate contact plugs 336b, 336c and 336d on third extending portions of second, third and fourth gate electrodes 310b, 310c and 310d may overlap the device isolation pattern 102. In this case, other gate contact plugs 335b, 335c and 335d contacting the second, third and fourth gate electrodes 310b, 310c and 310d may overlap the active region ACT.

According to an embodiment, a source-contact plug 341a contacting an upper surface of a source region 323 may have the same extending length as an upper surface of a first drain-contact plug 340a. In this case, the source-contact plugs 341a which are greater in number than the source-contact plugs 341 of FIG. 8A may be disposed. The source-contact plugs 341a may be arranged two-dimensionally along first and second directions Da and Db. According to an embodiment, the source-contact plugs 341a may form first, second and third rows. The first and second drain-contact plugs 340a and 340b may be disposed between the source-contact plugs 341a included in the first row, and the third and fourth drain-contact plugs 340c and 340d may be disposed between the source-contact plugs 341a included in the third row.

Four transistors disclosed in FIG. 9A may be implemented in one pair of NMOS sense amplifier drivers or one pair of PMOS sense amplifier drivers, as described with reference to FIGS. 5A, 6A and 6B. However, the present invention is not limited thereto. The transistors of FIG. 9A may be used for other function and/or purpose.

Figure 9B:
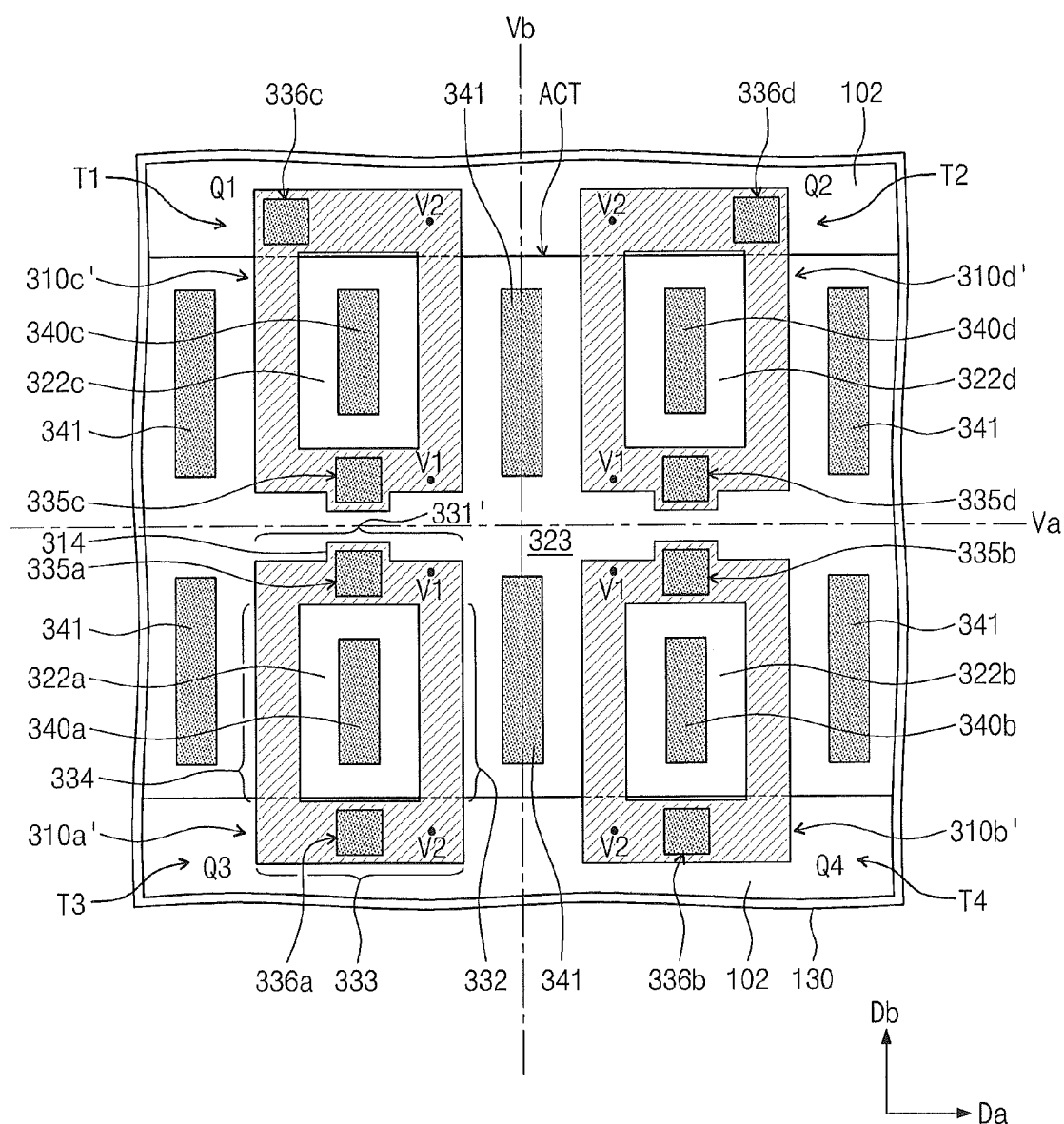
FIG. 9B is a plan view illustrating another modified example of an integrated circuit device according to other embodiments of the inventive concept.

FIG. 9B is a plan view illustrating another modified example of an integrated circuit device according to other embodiments of the inventive concept.

Referring to FIG. 9B, at least one of extending portions 331', 332, 333 and 334 of a first gate electrode 310a' may include a landing portion 314 and a non-landing portion. A first gate contact plug 335a may contact the landing portion 314. The landing portion 314 may have a larger width than the non-landing portion. According to the present modified example, the first extending portion 331' of the first gate electrode 310a' may include the landing portion 314 and the non-landing portion. The landing portion completely overlaps the active region ACT. Similarly to this, at least one of extending portions of second, third and fourth gate electrodes 310b, 310c and 310d may include a landing portion and a non-landing portion. All of the landing portions of the second, third and fourth gate electrodes 310b', 310c' and 310d' may overlap the active region ACT.

Four transistors disclosed in FIG. 9B may be implemented in one pair of NMOS sense amplifier drivers or one pair of PMOS sense amplifier drivers, as described with reference to FIGS. 5A, 6A and 6B. However, the present invention is not limited thereto. The transistors of FIG. 9B may be used for other function and/or purpose.

Figure 9C:
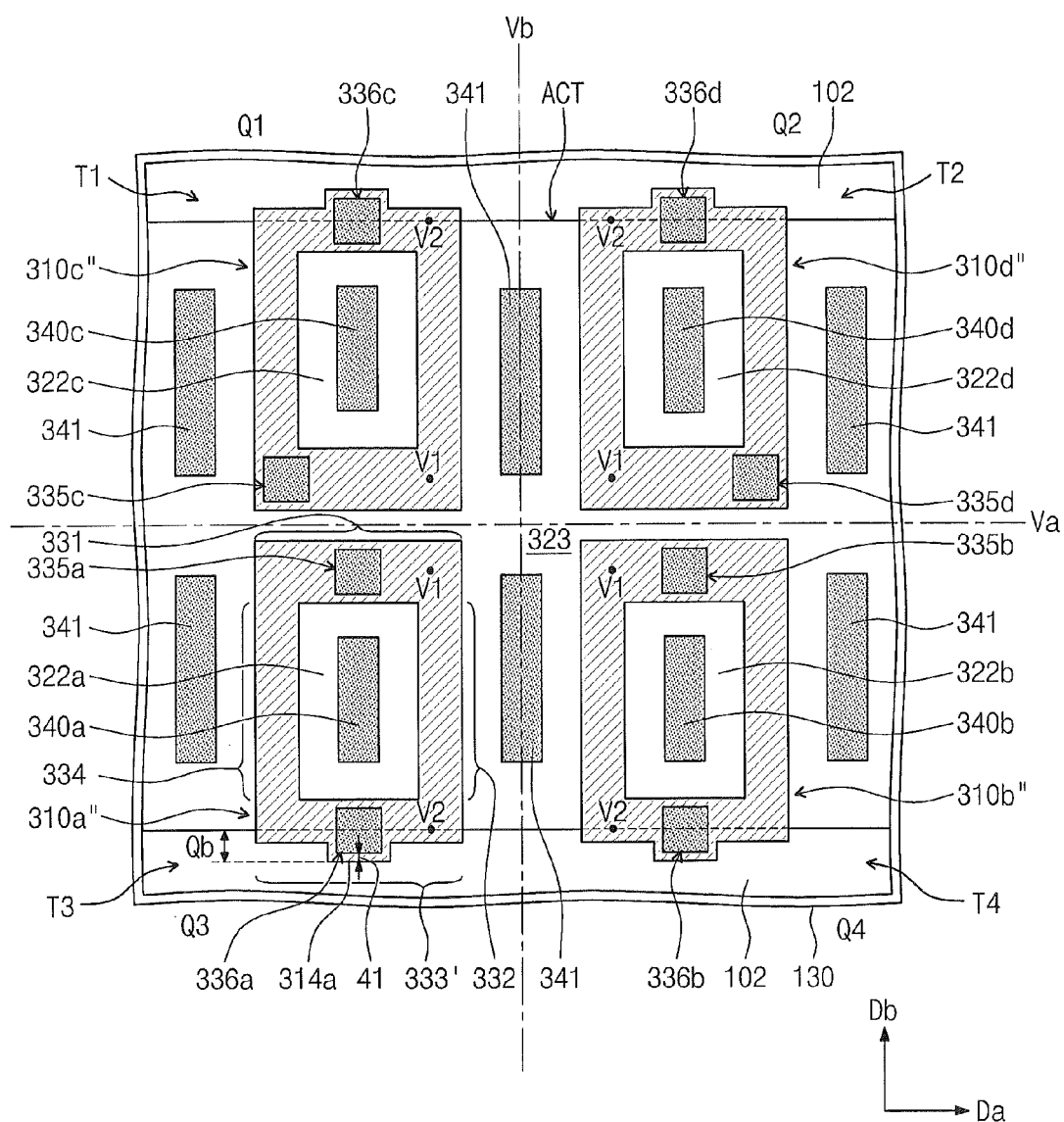
FIG. 9C is a plan view illustrating another modified example of an integrated circuit device according to other embodiments of the inventive concept.

FIG. 9C is a plan view illustrating another modified example of an integrated circuit device according to other embodiments of the inventive concept.

Referring to FIG. 9C, among extending portions 331, 332, 333' and 334 included in a first gate electrode 310a", the third extending portion 333' may include a landing portion 314a and a non-landing portion. A first gate contact plug 336a may contact the landing portion 314a. Some portion of the landing portion 314a may overlap some portion of the active region ACT, and the other portion of the landing portion 314a may overlap the device isolation pattern 102. The portion of the landing portion 314a overlapping the device isolation pattern 102 may have a length Qb in the second direction. The length Qb may be smaller than a sum of a width of the first gate contact plug 336a in the second direction, and a horizontal distance in the second direction Db between one end of the first gate contact plug 336a overlapping the device isolation pattern 102 and one end of the landing portion 314a. A second gate electrode 310b" may have a substantially symmetric structure to the first gate electrode 310a" in the first direction, and the third gate electrode 310c" may have a substantially symmetric structure to the first gate electrode 310a" in the second direction Db. A fourth gate electrode 310d" may have a substantially symmetric structure to the third gate electrode 310c" in the first direction Da.

Four transistors disclosed in FIG. 9C may be implemented in one pair of NMOS sense amplifier drivers or one pair of PMOS sense amplifier drivers, as described with reference to FIGS. 5A, 6A and 6B. However, the present invention is not limited thereto. The transistors of FIG. 9C may be used for other function and/or purpose.

The foregoing embodiments 1, 2 and 3 may be combined. For example, an integrated circuit device according to an embodiment of the inventive concept may include combinations of the transistors disclosed in the foregoing embodiments 1, 2 and 3.

The integrated circuit devices according to the foregoing embodiments may be mounted in various types of packages. Examples of the packages of the integrated circuit devices according to the embodiments of the inventive concept may include package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline package (SOP), a shrink small outline package (SSOP), a thin small outline package (TSOP), a thin quad flat package (TQFP), a system in package (SIP), a multi chip package (MCP), a wafer-level fabricated package (WFP), a wafer-level processed package (WSP) and so on. The packages equipped with the integrated circuit devices according to the embodiments of the inventive concept may further include a controller for controlling the integrated circuit device, and/or a logic device.

According to the embodiments of the inventive concept, at least some of the gate contact plug may overlap the active region. Due to this, the width (e.g., width of the active region corresponding to the channel width) of the active region within a given area may be increased to thus increase the amount of turn-on current of the field effect transistor. As a result, high integration and/or superior reliability may be realized.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A four transistor circuit layout for an integrated circuit substrate, comprising:
    an isolation region in the integrated circuit substrate that defines an active region, the active region extending along first and second different directions;
    a common source region of the four transistors that extends from a center of the active region along both the first and second directions to define four quadrants of the active region that are outside the common source region;
    four drain regions, a respective one of which is in a respective one of the four quadrants and spaced apart from the common source region; and
    four gate electrodes, a respective one of which is in a respective one of the four quadrants between the common source region and a respective one of the four drain regions, a respective gate electrode including a vertex and first and second extending portions, the first extending portions extending from the vertex along the first direction and the second extending portions extending from the vertex along the second direction,
    wherein the active region is recessed between the first extending portions of the gate electrodes of a first pair of the four transistors and between the first extending portions of the gate electrodes of a second pair of the four transistors, so that the isolation region protrudes between the first extending portions of the gate electrodes of the first pair of the four transistors and between the first extending portions of the gate electrodes of the second pair of the four transistors.

2. A four transistor circuit layout for an integrated circuit substrate, comprising:
    an isolation region in the integrated circuit substrate that defines an active region, the active region extending along first and second different directions;
    a common source region of the four transistors that extends from a center of the active region along both the first and second directions to define four quadrants of the active region that are outside the common source region;
    four drain regions, a respective one of which is in a respective one of the four quadrants and spaced apart from the common source region; and
    four gate electrodes, a respective one of which is in a respective one of the four quadrants between the common source region and a respective one of the four drain regions, a respective gate electrode including a vertex and first and second extending portions, the first extending portions extending from the vertex along the first direction and the second extending portions extending from the vertex along the second direction,
    wherein a respective gate electrode also includes a third extending portion that extends from an end of a respective second extending portion that is remote from the respective vertex and extends along the first direction, wherein the respective vertex is a first respective vertex and wherein the respective second and third extending portions define a respective second vertex therebetween;
    four gate contact plugs, a respective one of which is electrically connected to a respective one of the four gate electrodes, a first pair of which are connected to a respective one of a first pair of the gate electrodes adjacent the first vertexes thereof and a second pair of which are connected to a respective one of a second pair of the gate electrodes remote from the first vertexes thereof; and
    at least one of the second pair of the four gate contact plugs is on a respective one of the first extending portions of the second pair of the gate electrodes.

3. A four transistor layout according to claim 2 wherein the third extending portions at least partially overlap the isolation region.

4. A four transistor layout according to claim 2 wherein ends of the first and third extending portions of the four gate electrodes extend beyond the active region onto the isolation region.

5. A four transistor layout according to claim 2 wherein the pair of gate contact plugs that are connected to a respective one of a pair of the gate electrodes remote from the first vertexes thereof are contained within the active region.

6. A four transistor layout according to claim 5 wherein the four gate contact plugs are four first gate contact plugs, the four transistor layout further comprising four second gate contact plugs, a respective one of which is electrically connected to a respective one of the four gate electrodes, a first pair of which are connected to the respective one of the second pair of the gate electrodes adjacent the second vertexes thereof and a second pair of which are connected to the respective one of the first pair of the gate electrodes on the third extensions thereof remote from the second vertexes thereof.

7. A four transistor layout according to claim 2 wherein the at least one of the second pair of the four first gate contact plugs is between the isolation region and a respective one of the first vertexes of the second pair of the gate electrodes.

8. A four transistor circuit layout for an integrated circuit substrate, comprising:
    an isolation region in the integrated circuit substrate that defines an active region, the active region extending along first and second different directions;
    a common source region of the four transistors that extends from a center of the active region along both the first and second directions to define four quadrants of the active region that are outside the common source region;
    four drain regions, a respective one of which is in a respective one of the four quadrants and spaced apart from the common source region; and
    four gate electrodes, a respective one of which is in a respective one of the four quadrants between the common source region and a respective one of the four drain regions, a respective gate electrode including a vertex and first and second extending portions, the first extending portions extending from the vertex along the first direction and the second extending portions extending from the vertex along the second direction,
    wherein a respective gate electrode also includes a third extending portion that extends from an end of a respective second extending portion that is remote from the respective vertex and extends along the first direction, wherein the respective vertex is a first respective vertex and wherein the respective second and third extending portions define a respective second vertex therebetween, and wherein the third extending portions do not substantially overlap the active region.

9. A four transistor circuit layout for an integrated circuit substrate, comprising:

an isolation region in the integrated circuit substrate that defines an active region, the active region extending along first and second different directions;

a common source region of the four transistors that extends from a center of the active region along both the first and second directions to define four quadrants of the active region that are outside the common source region;

four drain regions, a respective one of which is in a respective one of the four quadrants and spaced apart from the common source region; and four gate electrodes, a respective one of which is in a respective one of the four quadrants between the common source region and a respective one of the four drain regions, a respective gate electrode including a vertex and first and second extending portions, the first extending portions extending from the vertex along the first direction and the second extending portions extending from the vertex along the second direction, wherein a respective gate electrode also includes a third extending portion that extends from an end of a respective second extending portion that is remote from the respective vertex and extends along the first direction, wherein the respective vertex is a first respective vertex and wherein the respective second and third extending portions define a respective second vertex therebetween, wherein a respective gate electrode also includes a fourth extending portion that extends from an end of a respective first extending portion that is remote from the respective first vertex to an end of the respective third extending portion that is remote from the respective second vertex, along the second direction, a respective gate electrode including the first through fourth extending portions defining a closed loop gate electrode pattern, a respective one of which surrounds a respective one of the drain regions; and four first gate contact plugs, a respective one of which is electrically connected to a respective midpoint of a respective one of the first and third extending portions of the gate electrodes of a first pair of the four transistors.

10. A four transistor layout according to claim 9 further comprising two second gate contact plugs, a respective one of which is electrically connected to a respective first vertex of the gate electrodes of a second pair of the four transistors.

11. A four transistor layout according to claim 10 further comprising two third gate contact plugs, a respective one of which is electrically connected at a respective intersection of a respective third and fourth gate extensions of the gate electrodes of the second pair of the four transistors.

* * * * *